(12) United States Patent
Katsuno et al.

(10) Patent No.: US 8,963,177 B2
(45) Date of Patent: Feb. 24, 2015

(54) SEMICONDUCTOR LIGHT EMITTING ELEMENT AND SEMICONDUCTOR LIGHT EMITTING DEVICE

(75) Inventors: Hiroshi Katsuno, Tokyo (JP); Yasuo Ohba, Kanagawa-ken (JP); Kei Kaneko, Kanagawa-ken (JP); Mitsuhiro Kushibe, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 613 days.

(21) Appl. No.: 12/718,492

(22) Filed: Mar. 5, 2010

(65) Prior Publication Data

US 2011/0049550 A1    Mar. 3, 2011

Related U.S. Application Data

(63) Continuation of application No. PCT/JP2009/065261, filed on Sep. 1, 2009.

(51) Int. Cl.
*H01L 33/50* (2010.01)
*H01L 33/46* (2010.01)
(Continued)

(52) U.S. Cl.
CPC .............. *H01L 33/46* (2013.01); *H01L 33/405* (2013.01); *H01L 33/60* (2013.01); *H01L 33/504* (2013.01);
(Continued)

(58) Field of Classification Search
CPC ....... H01L 33/36; H01L 33/38; H01L 33/382; H01L 33/385; H01L 33/387; H01L 33/40; H01L 33/405; H01L 33/42; H01L 33/46; H01L 33/60; H01L 2924/0002
USPC ............ 257/40, 93, 94, 98, 99, 101, E33.063, 257/E33.065, E33.005, E33.043, E33.055, 257/E25.009, E51.002, E51.02, E51.022
See application file for complete search history.

(56) References Cited

U.S. PATENT DOCUMENTS 5,952,681 A *   9/1999   Chen ............................... 257/89
2003/0006409 A1   1/2003   Ohba
(Continued)

FOREIGN PATENT DOCUMENTS

JP      2004-6498      1/2004
JP      2006-295132    10/2006
(Continued)

OTHER PUBLICATIONS

Notification of Reason(s) for Refusal issued by the Japanese Patent Office on Jun. 21, 2012, for Japanese Patent Application No. 2010-509048, and English-language translation thereof.
(Continued)

*Primary Examiner* — Ermias Woldegeorgis
(74) *Attorney, Agent, or Firm* — Finnegan, Henderson, Farabow, Garrett & Dunner, L.L.P.

(57) ABSTRACT

A semiconductor light emitting element, includes: a laminated structure body including an n-type semiconductor layer, a p-type semiconductor layer, and a light emitting layer; a p-side electrode provided in contact with the p-type semiconductor layer; an n-side electrode provided in contact with the n-type semiconductor layer; a highly reflective insulating layer provided in contact with the n-type semiconductor layer and having a higher reflectance than a reflectance of the n-side electrode; and an upper metal layer provided on at least a part of the n-side electrode and on at least a part of the highly reflective insulating layer and electrically connected to the n-side electrode. An area of a region of the n-side electrode in contact with the n-type semiconductor layer is smaller than an area of a region of the highly reflective insulating layer sandwiched between the n-type semiconductor layer and the upper metal layer.

31 Claims, 9 Drawing Sheets

(51) Int. Cl.
*H01L 33/40* (2010.01)
*H01L 33/60* (2010.01)

(52) U.S. Cl.
CPC ..... *H01L 2924/0002* (2013.01); *H01L 2224/13* (2013.01); *H01L 2224/48091* (2013.01); *H01L 2224/73265* (2013.01)
USPC .............................................. 257/98; 257/99

(56) References Cited

U.S. PATENT DOCUMENTS

| | | |
|---|---|---|
| 2004/0155250 A1 | 8/2004 | Ohba |
| 2005/0087755 A1* | 4/2005 | Kim et al. ........................ 257/98 |
| 2007/0023777 A1* | 2/2007 | Sonobe et al. ................. 257/103 |
| 2007/0034883 A1* | 2/2007 | Ohba ............................... 257/85 |
| 2008/0142821 A1* | 6/2008 | Sakamoto et al. .............. 257/98 |
| 2008/0185609 A1* | 8/2008 | Kozawa et al. ................. 257/99 |
| 2009/0050916 A1* | 2/2009 | Katsuno et al. ................. 257/98 |
| 2009/0057707 A1 | 3/2009 | Katsuno et al. |
| 2009/0200568 A1* | 8/2009 | Horie .............................. 257/98 |
| 2010/0051978 A1 | 3/2010 | Katsuno et al. |
| 2010/0051995 A1 | 3/2010 | Katsuno et al. |
| 2010/0059734 A1 | 3/2010 | Kaneko et al. |

FOREIGN PATENT DOCUMENTS

| | | |
|---|---|---|
| JP | 2007-324585 | 12/2007 |
| JP | 2007-329465 | 12/2007 |
| JP | 2008-41866 | 2/2008 |
| JP | 2008-192782 | 8/2008 |
| JP | 2008-288548 | 11/2008 |
| JP | 2009-49266 | 3/2009 |
| WO | WO 2007126094 A1 * | 11/2007 |
| WO | WO 2011/027418 A1 | 3/2011 |

OTHER PUBLICATIONS

Notification of Reason(s) for Refusal issued by the Japanese Patent Office on Sep. 18, 2013, for Japanese Patent Application No. 2012-245836, and English-language translation thereof.

* cited by examiner

SEMICONDUCTOR LIGHT EMITTING ELEMENT AND SEMICONDUCTOR LIGHT EMITTING DEVICE

CROSS-REFERENCE TO RELATED APPLICATIONS

This is a continuation application of International Application PCT/JP2009/065261, filed on Sep. 1, 2009; the entire contents of which are incorporated herein by reference.

BACKGROUND OF THE INVENTION

The invention relates to a semiconductor light emitting element and a semiconductor light emitting device.

As for semiconductor light emitting elements such as LEDs (Light Emitting Diodes), light generated in a light emitting layer is directly extracted to the outside of the element or is extracted to the outside after being reflected by various interfaces, electrodes, and the like in the element.

The shape of an element, the shape of an electrode, and the like are adjusted appropriately in order to increase the light extraction efficiency. However, such adjustment needs to be made while satisfying various requirements of an operating current of the element, the shape of the electrode for mounting, and light reflex properties. For this reason, there is a limitation in improvement of the light extraction efficiency by the appropriate adjustment.

JP-A 2007-324585 (Kokai) has disclosed a configuration in which a reflective dielectric multilayer film is provided on a side surface and a part of a main surface of a flip chip mounting type semiconductor light emitting element in order to improve the light extraction efficiency. However, there is room to improve operating properties, the light extraction efficiency, and mountability such as ease of alignment of a gold bump.

SUMMARY OF THE INVENTION

According to an aspect of the invention, there is provided a semiconductor light emitting element, including: a laminated structure body including an n-type semiconductor layer, a p-type semiconductor layer, and a light emitting layer provided between the n-type semiconductor layer and the p-type semiconductor layer; a p-side electrode provided in contact with the p-type semiconductor layer; an n-side electrode provided in contact with the n-type semiconductor layer; a highly reflective insulating layer provided in contact with the n-type semiconductor layer and having a higher reflectance to light emitted from the light emitting layer than a reflectance of the n-side electrode to the light; and an upper metal layer provided on at least a part of the n-side electrode and on at least a part of the highly reflective insulating layer and electrically connected to the n-side electrode, an area of a region of the n-side electrode in contact with the n-type semiconductor layer being smaller than an area of a region of the highly reflective insulating layer sandwiched between the n-type semiconductor layer and the upper metal layer.

According to another aspect of the invention, there is provided a semiconductor light emitting device including: a semiconductor light emitting element; and a mounting component, the semiconductor light emitting element being mounted on the mounting component, the semiconductor light emitting element including: a laminated structure body including an n-type semiconductor layer, a p-type semiconductor layer, and a light emitting layer provided between the n-type semiconductor layer and the p-type semiconductor layer; a p-side electrode provided in contact with the p-type semiconductor layer; an n-side electrode provided in contact with the n-type semiconductor layer; a highly reflective insulating layer provided in contact with the n-type semiconductor layer and having a higher reflectance to light emitted from the light emitting layer than a reflectance of the n-side electrode to the light; and an upper metal layer provided on at least a part of the n-side electrodes and on at least a part of the highly reflective insulating layer and electrically connected to the n-side electrode, an area of a region of the n-side electrode in contact with the n-type semiconductor layer being smaller than an area of a region of the highly reflective insulating layer sandwiched between the n-type semiconductor layer and the upper metal layer, the n-type semiconductor layer being exposed in an exposed region on a side of a first main surface of the laminated structure body, a part of the p-type semiconductor layer being removed in the exposed region, the n-side electrode and the highly reflective insulating layer being provided in contact with the exposed n-type semiconductor layer, the p-side electrode being provided in contact with the p-type semiconductor layer on a side of the first main surface of the laminated structure body, the n-side electrode being provided on the first main surface of the laminated structure body, the mounting component including a plurality of mounting electrodes, the first main surface of the laminated structure body and the mounting electrodes of the mounting component being disposed to face each other, the upper metal layer being electrically connected to one of the mounting electrodes, and the p-side electrode being electrically connected to another one of the mounting electrodes.

DETAILED DESCRIPTION

Figure 1A:
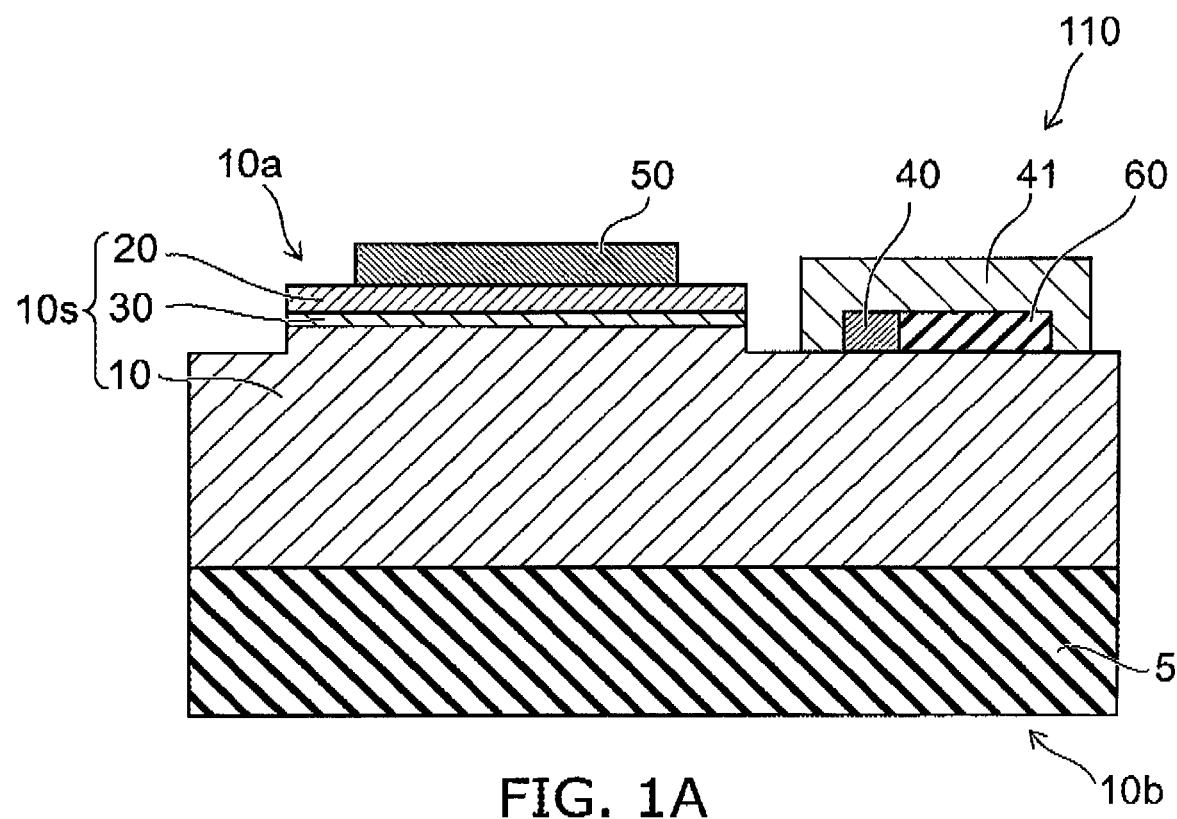
FIGS. 1A and 1B are schematic views illustrating a semiconductor light emitting element according to an embodiment.

Hereinafter, embodiments of the invention will be described in detail with reference to the drawings.

It should be noted that the drawings are schematic or conceptual, and that a relationship between the thickness and width of each portion, a ratio of dimensions between portions and the like may differ from actual ones. Moreover, there are differences in dimensions and ratios among the drawings even when the same portions are shown.

In the specification and the drawings of the application, the same reference numerals are given to the same components as those in the drawings already mentioned, and detailed description thereof will be omitted as appropriate.

First Embodiment

Figure 1B:
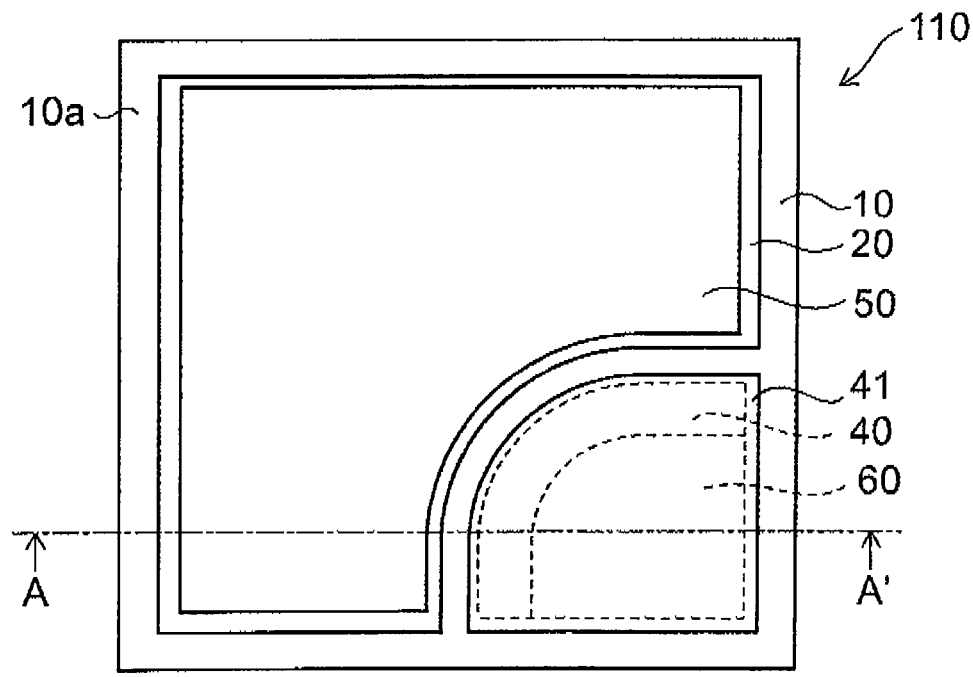

FIGS. 1A and 1B are schematic views illustrating the configuration of a semiconductor light emitting element according to a first embodiment of the invention.

Namely, FIG. 1B is a schematic plan view, and FIG. 1A is a cross-sectional view taken along line A-A' of FIG. 1B.

As shown in FIGS. 1A and 1B, a semiconductor light emitting element 110 according to this embodiment includes a laminated structure body 10s, a p-side electrode 50, an n-side electrode 40, a highly reflective insulating layer 60, and an n-side pad layer 41 (upper metal layer).

The laminated structure body 10s has an n-type semiconductor layer 10, a p-type semiconductor layer 20, and a light emitting layer 30 provided between the n-type semiconductor layer 10 and the p-type semiconductor layer 20. The light emitting layer 30 has a multiple quantum well structure, for example.

The p-side electrode 50 is provided in contact with the p-type semiconductor layer 20. The n-side electrode 40 is provided in contact with the n-type semiconductor layer 10.

The highly reflective insulating layer 60 is provided in contact with the n-type semiconductor layer 10. A reflectance to light (emitting light) emitted from the light emitting layer 30 of the highly reflective insulating layer 60 is higher than a reflectance to an emitting light of the n-side electrode 40. The n-side pad layer 41 is provided on at least a part of the n-side electrode 40 and at least a part of the highly reflective insulating layer 60 and electrically connected to the n-side electrode 40.

For example, the n-type semiconductor layer 10 of the laminated structure body 10s is provided on a substrate 5 made of sapphire, for example, via an AlN buffer layer. The light emitting layer 30 is provided on the n-type semiconductor layer 10, and the p-type semiconductor layer 20 is further provided on the light emitting layer 30.

Then, in the semiconductor light emitting element 110 of a specific example, the n-side electrode 40 and the p-side electrode 50 are provided on a first main surface 10a of the laminated structure body 10s.

In other words, in a region (a exposed region) where a part of the p-type semiconductor layer 20 and a part of the light emitting layer 30 on the first main surface 10a side of the laminated structure body 10s is removed by, for example, etching, the n-type semiconductor layer 10 is exposed, and the n-side electrode 40 and the highly reflective insulating layer 60 are provided on the n-type semiconductor layer 10 in the region (in the exposed region). Then, the p-side electrode 50 is provided on the p-type semiconductor layer 20 of the first main surface 10a.

A material having ohmic properties to the n-type semiconductor layer 10 is used for the n-side electrode 40. For example, a Ti/Al/Ni/Au laminated film can be used for the n-side electrode 40. The n-side electrode 40 becomes an ohmic contact region on the n-type semiconductor layer 10 by performing a sintering treatment. Note that, the thickness of the Tl/Al/Ni/Au laminated film is 300 nm, for example.

Note that, the reflectance to the emitting light of the n-side electrode 40 obtained by sintering the Ti/Al/Ni/Au laminated film is comparatively low, and is approximately 10%, for example. However, ohmic contact properties to the n-type semiconductor layer 10 are good. In other words, the material used for the n-side electrode 40 is selected by placing importance on electrical properties while the reflectance of the n-side electrode 40 to the emitting light emitted from the light emitting layer 30 is less demanded.

Moreover, silver or a silver alloy can also be used for the n-side electrode 40. In other words, as described later, when a crystal formed on a single-crystal AlN buffer layer is used as the n-type semiconductor layer 10, an impurity density in the contact layer of the n-type semiconductor layer 10 can be increased, and lower contact resistance and good ohmic properties can be obtained. Thereby, silver or a silver alloy, which usually has higher contact resistance and poor ohmic properties while having a higher reflectance, can be used as the n-side electrode 40.

On the other hand, a material and configuration having a higher reflectance to the emitting light emitted from the light emitting layer 30 are used for the highly reflective insulating layer 60. In other words, the reflectance of the highly reflective insulating layer 60 to the emitting light is relatively higher than that of the n-side electrode 40.

The highly reflective insulating layer 60 can include a plurality of dielectric films alternatively laminated and having a different refractive index from each other, for example. Thereby, the reflectance to the emitting light can be increased.

The highly reflective insulating layer 60 is provided immediately below the n-side pad layer 41 and in a region where the n-side electrode 40 is not formed, for example.

Then, the n-side pad layer 41 is provided on the n-side electrode 40. The n-side pad layer 41 is electrically connected to the n-side electrode 40 and further covers at least a part of the highly reflective insulating layer 60. In the specific example, the n-side pad layer 41 covers all over the n-side electrode 40 and the highly reflective insulating layer 60.

The n-side pad layer 41 is a portion serving as a pad for conducting current from the outside to the n-type semiconductor layer 10. In other words, a connecting member such as a gold bump and a bonding wire is provided in the region of the n-side pad layer 41.

For the n-side pad layer 41, a material and a configuration can be used in which adhesion to the highly reflective insulating layer 60, adhesion to the connecting member such as a gold bump and bonding wire, resistance against diffusion of various elements included in the connecting member, resistance against increase in temperature during a mounting process to the connecting member and the like, for example, are higher than those of the n-side electrode 40. For example, the n-side electrode 40 usually has a problem in adhesion to a gold bump or resistance against shock at the time of connection because the n-side electrode 40 undergoes the sintering treatment. However, such a problem can be avoided in the n-side pad layer 41 in which a material appropriate for a gold bump can be selected.

As the n-side pad layer 41, a Ti/Pt/Au laminated film is used, for example. The thickness of this Ti/Pt/Au laminated film is 500 nm, for example. Moreover, as described later, the n-side pad layer 41 is provided on the laminated structure body 10s side and can also have a layer including at least one of aluminum, an aluminum alloy, rhodium, and a rhodium alloy.

Then, an area of a region of the n-side electrode 40 in contact with the n-type semiconductor layer 10 (facing region) is set smaller than an area of a region of the highly reflective insulating layer 60 sandwiched between n-type semiconductor layer 10 and the n-side pad layer 41.

The area of the region of the n-side electrode 40 in contact with the n-type semiconductor layer 10 (facing region) is smaller than an area of a region of the highly reflective insulating layer 60 in contact with the n-type semiconductor layer 10 (facing region). Simultaneously, the area of the region of the n-side electrode 40 in contact with the n-type semiconductor layer 10 is smaller than an area of the region of the highly reflective insulating layer 60 in contact with the n-side pad layer 41 (facing region).

Thereby, the area of the n-side electrode 40 having a lower reflectance (area of the region where the n-side electrode 40 faces the n-type semiconductor layer 10) is made smaller than the area of the highly reflective insulating layer 60 having a higher reflectance (area of the region where the highly reflective insulating layer 60 faces the n-type semiconductor layer 10). As a result, a region that absorbs the emitting light is reduced, and the light extraction efficiency can be improved. For example, the area of the n-side electrode 40 having good ohmic properties and a lower reflectance is reduced to a minimum dimension that is necessary to reduce operating voltage. As a result, lower operating voltage and higher light extraction efficiency can be attained.

Further, the semiconductor light emitting element 110 employs a laminated structure including the n-side electrode 40 having good ohmic properties as an electrode connected to the n-side semiconductor 20 and the n-side pad layer 41 having good mountability such as adhesion, for example. Thereby, the connecting member such as a gold bump and bonding wire is connected to the n-side pad layer 41. Therefore, good connection properties with the connecting member such as adhesion are not demanded of the n-side electrode 40, and the n-side electrode 40 is required to satisfy ohmic properties with respect to the n-side semiconductor layer 10. For this reason, the ohmic properties with respect to n-type semiconductor layer 10 of the n-side electrode 40 are maximized. Thereby, the area of the n-side electrode 40 can be minimized to reduce the operating voltage and obtain good operating properties.

Then, the area of the highly reflective insulating layer 60 having a higher reflectance can be increased by the reduced area of the n-side electrode 40, so that the area of the highly reflective insulating layer 60 can be maximized.

Then, the area of the n-side pad layer 41 can be maximized by providing the n-side pad layer 41 not only on the n-side electrode 40 but also on the highly reflective insulating layer 60. Then, an increased area of the n-side pad layer 41 facilitates formation of a gold bump, so that the mountability can be improved.

In other words, as described above, the area of the region of the n-side electrode 40 in contact with the n-type semiconductor layer 10 (facing region) is set smaller than the area of the region of the highly reflective insulating layer 60 in contact with the n-side pad layer 41 (facing region). Thereby, the entire area of the n-side pad layer 41 can be maximized.

Thus, according to the semiconductor light emitting element 110, the area of the n-side electrode 40 having good ohmic properties is minimized, and the area of the highly reflective insulating layer 60 can be maximized. Further, the area of the n-side pad layer 41 having good mountability such as adhesion can be maximized. Consequently, a semiconductor light emitting element having low operating voltage, high light extraction efficiency, and excellent mountability can be provided.

Namely, when the n-side electrode 40, the highly reflective insulating layer 60, and the n-side pad layer 41 provided thereon are disposed on the exposed surface of the n-type semiconductor layer 10 on the first main surface 10*a* of the semiconductor light emitting element 110, the area of the region of the n-side electrode 40 in contact with the n-type semiconductor layer 10 (facing region) is set smaller than the area of the region of the highly reflective insulating layer 60 sandwiched between n-type semiconductor layer 10 and the n-side pad layer 41. Thereby, the area of the region of the n-side electrode 40 directly facing the n-type semiconductor layer 10 can be minimized, and the areas of the highly reflective insulating layer 60 and the n-side pad layer 41 can be maximized, respectively.

Further, the area of the region of the n-side electrode 40 facing the n-side pad layer 41 is desirably formed smaller than the area of the region of the highly reflective insulating layer 60 sandwiched between the n-type semiconductor layer and the n-side pad layer 41. This can ensure minimization of the area of the region of the n-side electrode 40 directly facing the n-type semiconductor layer 10, and respective maximization of the areas of the highly reflective insulating layer 60 and the n-side pad layer 41.

The loss caused by absorption of light in the p-side electrode 50 can be suppressed by using a material having a relatively high reflectance for the p-side electrode 50. The configuration of the n-side electrode 40, the highly reflective insulating layer 60, and the n-side pad layer 41 in this embodiment can reduce the loss caused by absorption of the light in the n-side electrode 40.

As shown in FIG. 1B, in the semiconductor light emitting element 110, the first main surface 10*a* of the laminated structure body 10*s* has a square shape, and the n-side electrode 40 is provided in a corner of the first main surface 10*a* and close to one vertex of this square. However, the invention is not limited thereto. As describes later, various modifications can be made to the arrangement of the n-side electrode 40, the p-side electrode 50, the highly reflective insulating layer 60, and the n-side pad layer 41 on the first main surface 10*a* as well as those shapes.

Hereinafter, a specific example of the configuration of the semiconductor light emitting element 110 and an example of the manufacturing method thereof will be described.

The laminated structure body 10*s* of the semiconductor light emitting element 110 includes a nitride semiconductor formed on the substrate 5 made of sapphire, for example. Each layer that forms the laminated structure body 10*s* is formed on the substrate 5 whose surface is formed of a sapphire c plane, for example, by using metal organic chemical vapor deposition as follows.

Namely, first, as a buffer layer, a first AlN buffer layer having a high carbon concentration (for example, in a carbon concentration of $3 \times 10^{18}$ cm$^{-3}$ to $5 \times 10^{20}$ cm$^{-3}$ and a thickness of 3 nm (nanometer) to 20 nm), a second AlN buffer layer having high purity (for example, in a carbon concentration of $1 \times 10^{16}$ cm$^{-3}$ to $3 \times 10^{18}$ cm$^{-3}$ and a thickness of 2 μm (micrometer)), and a non-doped GaN buffer layer (for example, thickness of 3 μm) are sequentially formed in this order on the substrate 5. The aforementioned first AlN buffer layer and second AlN buffer layer having high purity are each a single-crystal aluminum nitride layer.

On the non-doped GaN buffer layer, as the n-type semiconductor layer 10, a Si-doped n-type GaN layer (for example, in a Si concentration of $1 \times 10^{18}$ cm$^{-3}$ to $5 \times 10^{18}$ cm$^{-3}$ and a thickness of 4 µm), a Si-doped n-type GaN contact layer (for example, in a Si concentration of $5\times10^{18}$ cm$^{-3}$ to $1\times10^{20}$ cm$^{-3}$ and a thickness of 0.2 µm), and a Si-doped n-type $Al_{0.10}Ga_{0.90}N$ clad layer (for example, in a Si concentration of $1\times10^{18}$ cm$^{-3}$ and a thickness of 0.02 µm) are sequentially formed in this order.

On the Si-doped n-type $Al_{0.11}Ga_{0.89}N$ clad layer, as the light emitting layer 30, a Si-doped n-type $Al_{0.11}Ga_{0.89}N$ barrier layer and a GaInN well layer are alternatively laminated in three periods. Further, a final $Al_{0.11}Ga_{0.89}N$ barrier layer having a multiple quantum well structure and a Si-doped n-type $Al_{0.11}Ga_{0.89}N$ layer (for example, in a Si concentration of $0.8\times10^{19}$ cm$^{-3}$ to $1.0\times10^{19}$ cm$^{-3}$ and a thickness of 0.01 µm) are further laminated. The Si-doped n-type $Al_{0.11}Ga_{0.89}N$ barrier layer has a Si concentration of $1.1\times10^{19}$ cm$^{-3}$ to $1.5\times10^{19}$ cm$^{-3}$, for example. The thickness of the final $Al_{0.11}Ga_{0.89}N$ barrier layer is 0.075 µm, for example. A wavelength of the emitting light in the light emitting layer 30 is 380 m, for example.

Further, as the p-type semiconductor layer 20, a non-doped $Al_{0.11}Ga_{0.89}N$ spacer layer (for example, thickness of 0.02 µm), a Mg-doped p-type $Al_{0.28}Ga_{0.72}N$ clad layer (for example, in a Mg concentration of $1\times10^{19}$ cm$^{-3}$ and a thickness of 0.02 µm), a Mg-doped p-type GaN contact layer (for example, in a Mg concentration of $1\times10^{19}$ cm$^{-3}$ and a thickness of 0.1 µm, and a heavily Mg-doped p-type GaN contact layer (for example, in a Mg concentration $2\times10^{20}$ cm$^{-3}$ and a thickness of 0.02 µm) are sequentially formed in this order.

Ohmic properties with the p-side electrode 50 improve by setting the Mg concentration of the heavily Mg-doped p-type GaN contact layer to a high value of not less than $1\times10^{20}$ cm$^{-3}$ and less than $1\times10^{21}$ cm$^{-3}$. However, in the case of the semiconductor light emitting diode, unlike semiconductor laser diodes, the heavily Mg-doped p-type GaN contact layer is closer to the light emitting layer 30. For that reason, deterioration of properties caused by Mg diffusion is concerned. Then, using a large contact area of the p-side electrode 50 and the heavily Mg-doped p-type GaN contact layer and a low current density at the time of operation, the Mg concentration of the heavily Mg-doped p-type GaN contact layer is suppressed to the value not less than $1\times10^{19}$ cm$^{-3}$ and less than $1\times10^{20}$ cm$^{-3}$ without significantly impairing electrical properties. Thereby, diffusion of Mg can be prevented, and light emitting properties can be improved.

The first AlN buffer layer having a high carbon concentration serves to relieve differences in a crystal form from that of the substrate 5 and reduces particularly screw dislocation. Moreover, a surface of the second MN buffer layer having high purity becomes flat at an atom level. This reduces defects of the non-doped Ga buffer layer grown on this second AlN buffer layer having high purity. However, in order to obtain such an effect, the thickness of the second AlN buffer layer having high purity is preferably thicker than 1 µm. Moreover, in order to prevent a warp caused by distortion, the thickness of the second AlN buffer layer having high purity is desirably not more than 4 µm. The material used for the second AlN buffer layer having high purity is not limited to AlN, and $Al_xGa_{1-x}N$ ($0.8\leq x\leq 1$) may be used. Thereby, a warp of wafer can be compensated.

The non-doped GaN buffer layer plays a role of reducing defects because the non-doped GaN buffer layer is grown by three-dimensional island growth on the second AlN buffer layer having high purity. In order for a growth surface of the non-doped GaN buffer layer to become flat, the non-doped GaN buffer layer needs to be an average thickness of not less than 2 µm. From a viewpoint of repeatability and reduction in a warp, a thickness of 4 µm to 10 µm is appropriate as the total thickness of the non-doped GaN buffer layer.

By employing these buffer layers, defects can be reduced to approximately ¹⁄₁₀ as compared with conventional AlN buffer layers grown at a low temperature. With this technique, in spite of heavy Si doping of the n-type GaN contact layer and the emitting light in an ultraviolet band, a highly efficiently semiconductor light emitting element can be manufactured. Absorption of the light in the buffer layer can also be suppressed by reducing crystal defects in the buffer layer.

Thus, the laminated structure body 10s may further include the substrate 5 made of sapphire and provided on a side of a second main surface 10b facing the first main surface 10a in which the n-side electrode 40 and the p-side electrode 50 are provided. Then, the n-type semiconductor layer 10, the fight emitting layer 30, and the p-type semiconductor layer 20 are desirably formed on the aforementioned substrate 5 via a single-crystal aluminum nitride layer (for example, the aforementioned first AlN buffer layer and second AlN buffer layer having high purity). The substrate 5 and at least a part of the aforementioned buffer layer may be removed also at this time.

Moreover, desirably, a portion of the aforementioned aluminum nitride layer provided on the substrate 5 side has relatively a higher concentration of carbon than a portion of the aforementioned aluminum nitride layer provided on a side opposite to the substrate 5. That is, the aluminum nitride layer may have a first portion and a second portion, the first portion being provided between the substrate and a second portion. The first portion has a carbon concentration relatively higher than a carbon concentration in the second portion. In other words, desirably, the first AlN buffer layer having a high carbon concentration is provided on the substrate 5 side, and the second AlN buffer layer having high purity is provided on the side opposite to the substrate 5.

Next, description will be given of formation of the n-side electrode 40 and the p-side electrode 50 in the aforementioned laminated structure body 10s.

First, in a part of a region of a main surface of the laminated structure body 10s, a part of the p-type semiconductor layer 20 and a part of the light emitting layer 30 are removed by dry etching using a mask so that an n-type contact layer (for example, the aforementioned Si-doped n-type GaN contact layer) is exposed to the surface.

Next, a patterned resist for lift-off is formed on the exposed n-type contact layer, and a Ti/Al/Ni/Au laminated film is formed using a vacuum evaporation apparatus to form the n-side electrode 40. The thickness of the Ti/Al/Ni/Au laminated film is 300 nm, for example. Then, the sintering treatment is performed in a nitrogen atmosphere at 650° C.

Next, in order to form the p-side electrode 50, a patterned resist for lift-off is formed on a p-type contact layer (for example, the aforementioned heavily Mg-doped p-type GaN contact layer). An Ag/Pt laminated film is formed so as to have a thickness of 200 nm using a vacuum evaporation apparatus. After lifting off the aforementioned resist for lift-off, the sintering treatment is performed in a nitrogen atmosphere at 650° C. Thereby, the p-side electrode 50 is formed.

Next, a dielectric laminated film serving as the highly reflective insulating layer 60 is formed on the n-type semiconductor layer 10 exposed from the n-side electrode 40.

In the dielectric laminated film, not less than two kinds of dielectrics whose refractive indexes are different from each other are laminated so as to form not less than two layers. For example, a laminated film obtained by laminating five combinations of a laminated film of a first dielectric layer (for example, a $SiO_2$ layer) and a second dielectric layer (for example, a $TiO_2$ layer) whose refractive indexes are different from each other (namely, a laminated film having a dielectric layer consisting of ten layers in total) can be used as the dielectric laminated film.

At this time, the thickness of the first dielectric layer and the second dielectric layer is set at a thickness of $\lambda/(4n)$ when each refractive index is n and a wavelength of the emitting light from the light emitting layer 30 is $\lambda$. Namely, the dielectric laminated film is formed by alternately laminating multiple first dielectric layers having a first refractive index $n_1$ and multiple second dielectric layers having a second different refractive index $n_2$ different from the first refractive index $n_1$. When the wavelength of the emitting light of the light emitting layer 30 is $\lambda$, the thickness of the first dielectric layers is substantially $\lambda/(4n_1)$, and the thickness of the second dielectric layers is substantially $\lambda/(4n_2)$. Thereby, the emitting light from the light emitting layer 30 can be reflected efficiently and can be reflected to the first semiconductor layer 10 side and the second semiconductor layer 20 side.

The highly reflective insulating layer 60 (dielectric laminated film) covers a part of the n-side electrodes 40 and may overlap the n-side electrode 40. Moreover, the highly reflective insulating layer 60 (dielectric laminated film) does not always need to contact the n-side electrode 40.

Then, for example, the Ti/Pt/Au laminated film having a thickness of 500 nm is formed as the n-side pad layer 41 so as to cover the n-side electrode 40 and the highly reflective insulating layer 60.

Next, the laminated structure body 10s is cut by a cleavage or a diamond blade to obtain individual elements. Thus, the semiconductor light emitting element 110 is manufactured.

A current injected from the outside of the semiconductor light emitting element 110 into the p-side electrode 50 and flowing to the n-side electrode 40 through the laminated structure body 10s is extracted through the n-side electrode 40 to the outside of the semiconductor light emitting element 110. Namely, wire bonding and a bump to contact the semiconductor light emitting element 110 with an external terminal are formed on the n-side pad layer 41. The n-side pad layer 41 is designed to include an area having a certain size or larger so that the aforementioned wire bonding and bump are securely disposed in a region within the n-side pad layer 41. For example, the width (length) of the region where the n-side pad layer 41 is formed is approximately 50 μm to 150 μm, for example.

At this time, the area of the n-side electrode 40 having a low reflectance can be reduced to a minimum area necessary to reduce the operating voltage, while the area of the highly reflective insulating layer 60 is increased as much as possible. Additionally, the area of the n-side pad layer 41 provided thereon can be increased. Thereby, the region where the emitting light is absorbed can be reduced, the reflection region can be increased, and the light emitted from the light emitting layer 30 can be extracted to the outside of the semiconductor light emitting element 110 with high efficiency.

Then, the n-side pad layer 41 having adhesion and various resistance larger than those of the n-side electrode 40 is laminated on the n-side electrode 40, and an external connecting member is connected to this n-side pad layer 41. For that reason, secure electrical connection can be obtained, and productivity can be improved. Reliability is also improved.

Thus, according to the semiconductor light emitting element 110, a semiconductor light emitting element having low operating voltage, high efficiency of extracting the light, high mountability, high throughput, and high reliability can be provided.

Then, when flip chip mounting is performed, much of the emitting light that repeats reflection within the semiconductor layer can be reflected to the substrate 5 side. Thereby, the light extraction efficiency can be improved.

In the semiconductor light emitting element 110 according to this embodiment, a material used for the semiconductor layer including the n-type semiconductor layer 10, the p-type semiconductor layer 20, and the light emitting layer 30 is not limited in particular. A gallium nitride based compound semiconductor such as $Al_xGa_{1-x-y}In_yN$ (x≥0, y≥0, x+y≤1) is used. A method for forming these semiconductor layers is not limited in particular. For example, techniques such as metal organic chemical vapor deposition and molecular beam epitaxy can be used.

A material used for the substrate 5 is not limited in particular, and sapphire, SiC, GaN, GaAs, Si, and the like can be used. The substrate 5 may be eventually removed after forming the laminated structure body 10s.

The p-side electrode 50 can include at least silver or a sliver alloy.

Reflection efficiency of a single layer film made of a metal other than silver to light in a visible right band region is likely to deteriorate as the wavelength becomes shorter in the ultraviolet region of not more than 400 nm. On the other hand, silver has high reflection efficiency properties also to the light in the ultraviolet band of not less than 370 nm and not more than 400 nm. For that reason, when the semiconductor light emitting element is one emitting ultraviolet light and the p-side electrode 50 is made of a silver alloy, the p-side electrode 50 on the side of the semiconductor interface desirably has a larger silver component ratio. The thickness of the p-side electrode 50 is preferably not less than 100 nm in order to ensure reflection efficiency of the light.

The p-side electrode 50 can include a silver (Ag) contained film in contact with the p-type semiconductor layer 20 and a platinum contained film stacked on the silver contained film. The p-side electrode 50 is formed of the Ag/Pt laminated film, and subsequently the sintering treatment is performed. Thereby, Pt can be diffused very slightly at an interface between a p-GaN contact layer (for example, the aforementioned heavily Mg-doped p-type GaN contact layer) and Ag. Thereby, adhesion of Ag improves. Additionally, contact resistance can be reduced without impairing highly efficient reflectivity unique to Ag. Thereby, high-level compatibility with highly efficient reflectivity and low operating voltage properties, which are demanded of the p-side electrode 50, can be obtained. For example, when the Ag/Pt laminated film is used for the p-side electrode 50, compared with a case where an Ag single layer film is used, the operating voltage at 20 mA can be reduced by 0.3 V while an output of the light shows approximately the same value.

Ag forms a solid solution with Pt, and Ag forms a solid solution with Pd. Consequently, migration of Ag can be suppressed by mixing of Pt or Pd with Ag, Particularly, Pd forms a complete solid solution with Ag. Consequently, migration of Ag can be suppressed more effectively. By using the combination of these for the p-side electrode 50, high reliability can be obtained at the time of applying a large current.

When silver or a silver alloy is used for the p-side electrode 50, risks of inferior insulation and poor breakdown voltage caused by migration of silver or the silver alloy are more reduced as a distance between the p-side electrode 50 and the n-side electrode 40 is larger. The light extraction efficiency is increased when the p-side electrode 50 facing the n-side electrode 40 in the vicinity of a center of the semiconductor light emitting element as viewed from a laminating direction of the laminated structure body 10s is formed to an edge of the p-type contact layer as long as process conditions such as exposure precision allow.

In the semiconductor light emitting element 110, the n-side electrode 40 is provided within a plane surface parallel to the first main surface 10a and closer to the p-side electrode 50 side than the highly reflective insulating layer 60. Namely, in the specific example, the highly reflective insulating layer 60 is not provided between the n-side electrode 40 and the p-side electrode 50. Thereby, the n-side electrode 40 and the p-side electrode 50 can be laminated close to each other so that a current can be efficiently conducted to the laminated structure body 10s.

When a current path that flows from the p-side electrode 50 into the n-side electrode 40 is considered, the current is likely to concentrate on a region where a distance between the p-side electrode 50 and the n-side electrode 40 is the shortest. Accordingly, in order to relieve electric field concentration, it is preferably designed so that in the region where the p-side electrode 50 contacts the n-side electrode 40, the region having the shortest distance between the p-side electrode 50 and the n-side electrode 40 may be provided as long as possible.

Moreover, when viewed from the laminating direction of the laminated structure body 10s, the width of the current path between the p-side electrode 50 and the n-side electrode 40 is wider as the distance of the region where the p-side electrode 50 and the n-side electrode 40 face each other is larger. Thus, the electric field concentration is relieved to suppress deterioration of the p-side electrode 50.

In consideration of the aforementioned effect, the areas and shapes of the p-side electrode 50 and the n-side electrode 40 and the distance between the p-side electrode 50 and the n-side electrode 40 are set appropriately.

An ohmic contact region increases as the area of the n-side electrode 40 is larger. As a result, the operating voltage tends to reduce. However, the current path at the time of operation tends to concentrate on the n-side electrode 40 in the region where the n-side electrode 40 faces the p-side electrode 50. For that reason, when the area of the n-side electrode 40 is larger than a certain size, the tendency of reduction in the operating voltage accompanied with the increased area of the n-side electrode 40 is saturated. On the other hand, the smaller area of the n-side electrode 40 can increase the area of the highly reflective insulating layer having highly efficient reflectivity. Accordingly, improvement in the light extraction efficiency is expected. Moreover, the smaller area of the n-side electrode 40 decreases a proportion of absorption of the reflected light within the laminated structure body 10s when the light enters the n-side electrode 40. Accordingly, improvement in the light extraction efficiency is expected.

In consideration of the aforementioned effect, the areas and shapes of the n-side electrode 40 having the ohmic properties and the highly reflective insulating layer 60 having the highly efficient reflectivity are set appropriately.

When a dielectric laminated film is used for the highly reflective insulating layer 60, the reflectance increases and a margin of the thickness and wavelength also increases as a refractive index ratio of the combined dielectric bodies is larger and as the number of combinations (the number of pairs) of layers having different refractive indexes is larger.

Moreover, the reflectance increases as an incident angle of the light that enters the highly reflective insulating layer 60 (for example, dielectric laminated film) from the laminated structure body 10s is inclined with respect to a normal of the highly reflective insulating layer 60. Then, total reflection occurs at a certain threshold angle.

On the basis of the aforementioned properties, the conditions on the dielectric laminated film serving as the highly reflective insulating layer 60 are set appropriately. Thereby, the highly reflective insulating layer 60 can function as a reflecting film having performance higher than that of a metal reflection film and can improve the light extraction efficiency. In the semiconductor light emitting element 110 according to this embodiment, a design reflectance of the dielectric laminated film used as the highly reflective insulating layer 60 is 99.7%.

Oxide, nitride, acid nitride, or the like of silicon (Si), aluminum (Al), zirconium (Zr), titanium (Ti), niobium (Nb), tantalum (Ta), magnesium (Ma), hafnium (Hf), cerium (Ce), zinc (Zn), and the like can be used for the dielectric laminated film (i.e., the highly reflective insulating layer 60).

The total thickness of the laminated dielectric film is desirably not less than 50 nm for ensured insulation and desirably not more than 1000 nm for suppression of cracks in the dielectric film. In order to suppress stress between materials of different kinds caused by generation of heat at the time of operation, a first layer of the dielectric laminated film on the side of the semiconductor layer is particularly preferably a material having a coefficient of linear expansion close to that of the semiconductor layer. For example, when the semiconductor layer is made of GaN, the first layer of the dielectric laminated film on the side of the semiconductor layer is preferably made of, for example, SiN. The dielectric laminated film can relieve the stress applied to the inside of the dielectric laminated film by laminating dielectric bodies of different kinds. Accordingly, as compared with the case of a single layer, damages such as breakage, cracks, and the like are hardly generated even when the total thickness increases. Additionally, the dielectric laminated film can also relieve the stress applied to the semiconductor layer. Accordingly, reliability improves. The effect of relieving the stress is particularly accelerated by laminating the dielectric body having tensile stress and compression stress.

Use of a crystal formed on a single-crystal AlN buffer layer allows heavy Si doping of the n-type GaN contact layer to significantly reduce contact resistance with respect to the n-side electrode 40. This enables silver or a silver alloy, which conventionally provides a highly efficiently reflective film having poor ohmic properties and larger contact resistance, to be used as the n-side electrode 40. Further improvement in the light extraction efficiency is expected. Further, by reduced crystal defects, higher light emitting efficiency can be obtained in a wavelength region shorter than 400 nm where the efficiency usually deteriorates.

Thus, the n-side electrode 40 can include silver or a silver alloy. In this case, the ratio of the silver component is desirably larger on the n-type semiconductor layer 10 side of the n-side electrode 40. The thickness of the n-side electrode 40 is preferably not less than 100 nm in order to ensure the reflection efficiency to the light.

When an amorphous or polycrystalline AlN layer is provided on the substrate 5 in order to relieve differences in the crystal form on the substrate 5, the buffer layer itself acts as a light absorbing body to reduce the light extraction efficiency as a light emitting element. To avoid this, the n-type semiconductor layer 10, the light emitting layer 30, and the p-type semiconductor layer 20 are formed on the substrate 5 made of sapphire via a single-crystal AlN buffer layer having a high carbon concentration (for example, the aforementioned first AlN buffer layer) and a single-crystal AlN buffer layer having high purity (for example, the aforementioned second AlN buffer layer having high purity). Thereby, these buffer layers hardly absorb the light. Furthermore, thereby, crystal defects can be reduced significantly, leading to significant reduction in the absorber within the crystal. In this case, the number of times of reflection of the emitting light within the crystal can be increased so that the light extraction efficiency in a transverse direction (direction toward the end face) of the laminated structure body 10s can be improved. Additionally, the light can be efficiently reflected to the p-side electrode 50 and the highly reflective insulating layer 60, which are highly efficiently reflective regions.

First Comparative Example

Figure 2A:
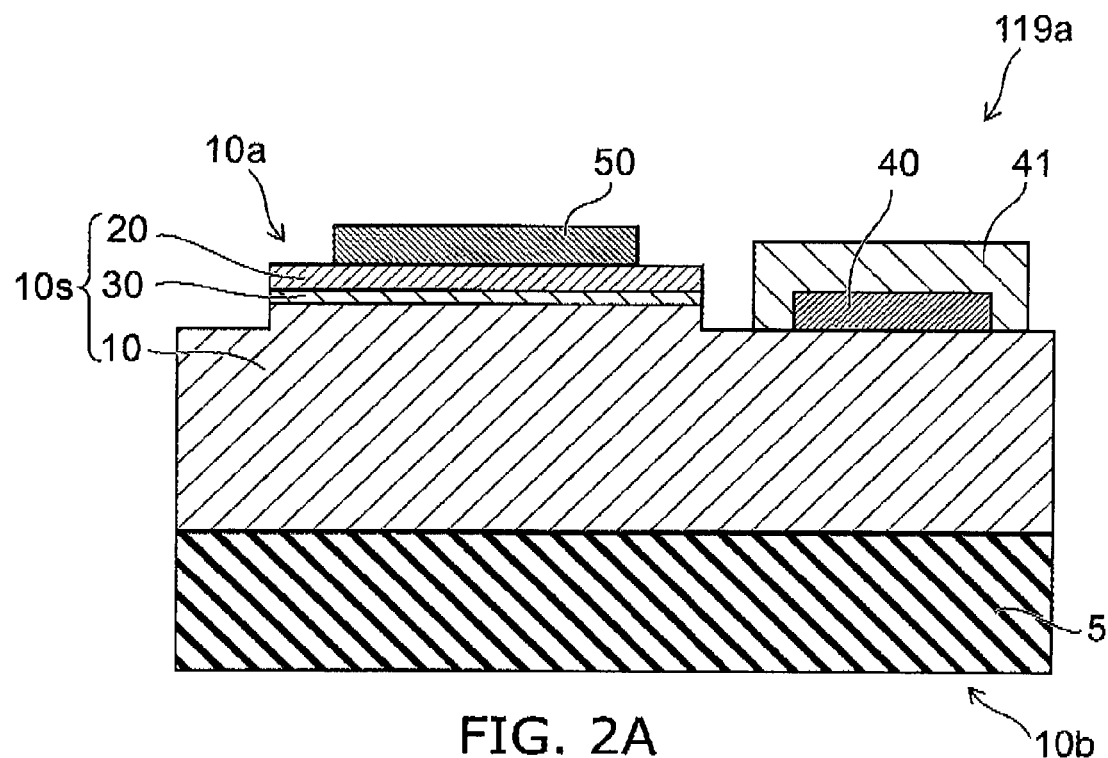
FIGS. 2A and 2B are schematic views illustrating a semiconductor light emitting element according to a first comparative example.
Figure 2B:
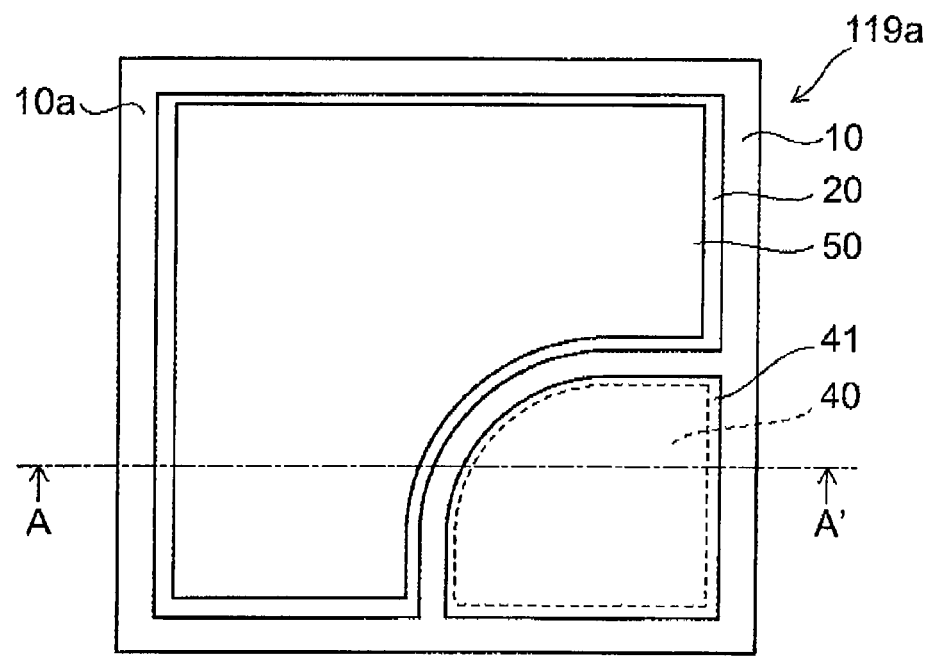

FIGS. 2A and 2B are schematic views illustrating the structure of a semiconductor light emitting element according to a first comparative example.

Namely, FIG. 2B is a schematic plan view, and FIG. 2A is a cross-sectional view taken along line A-A' in FIG. 2B. As shown in FIG. 2, in a semiconductor light emitting element 119a according to the first comparative example, the n-side electrode 40 and the n-side pad layer 41 thereon are provided on the first main surface 10a of the n-type semiconductor layer 10 while the highly reflective insulating layer 60 is not provided.

In production of the semiconductor light emitting element 119a according to the first comparative example having such a configuration, in the same manner as the semiconductor light emitting element 110, the laminated structure body 10s is formed, and subsequently, the p-type semiconductor layer 20 and the light emitting layer 30 are removed so as to expose the n-type contact layer to the surface, the n-side electrode 40 is formed, and the sintering treatment is performed. At this time, a shape of a mask to be used is different from that of the semiconductor light emitting element 110, and a planar shape of the n-side electrode 40 has a shape shown in FIG. 2B. Then, similarly, the p-side electrode 50 is formed, and the n-side pad layer 41 is formed so as to cover the n-side electrode 40.

In such a semiconductor light emitting element 119a according to the first comparative example, no highly reflective insulating layer 60 is provided; and the n-side electrode 40 having a low reflectance occupies a large area. This causes a low extraction efficiency of the light emitted from the light emitting layer 30.

Second Comparative Example

Figure 3A:
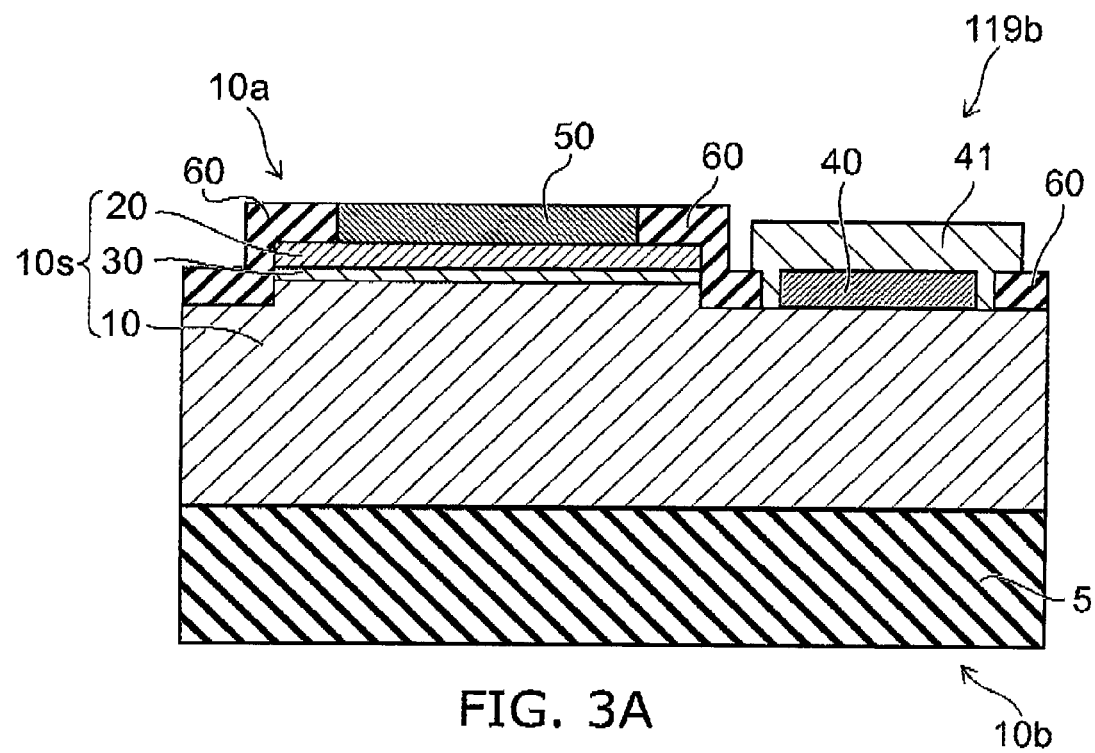
FIGS. 3A and 3B are schematic views illustrating a semiconductor light emitting element according to a second comparative example.
Figure 3B:
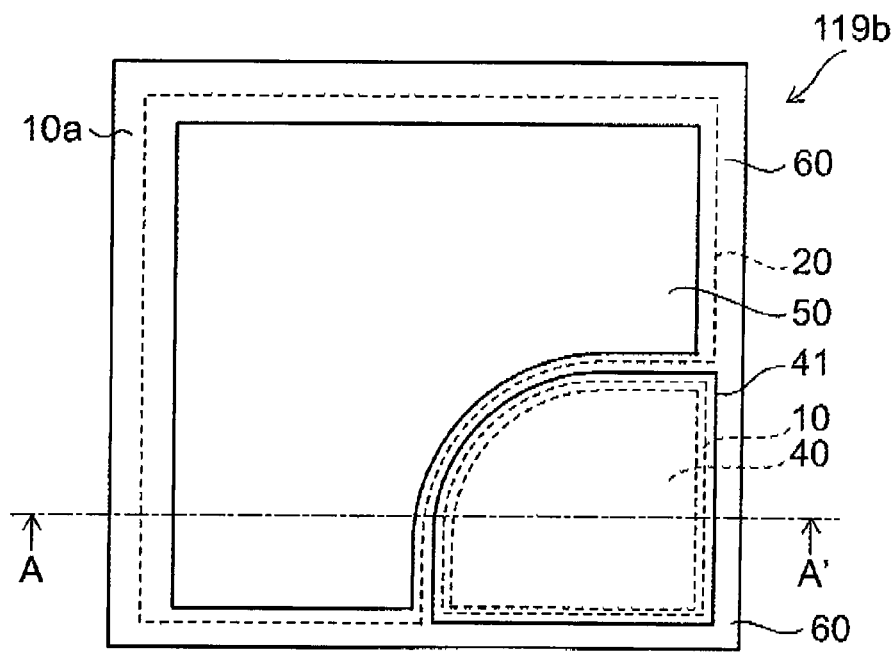

FIGS. 3A and 3B are schematic views illustrating the structure of a semiconductor light emitting element according to a second comparative example.

Namely, FIG. 3B is a schematic plan view, and FIG. 3A is a cross-sectional view taken along line A-A' in FIG. 3B.

As shown in FIGS. 3A and 3B, in a semiconductor light emitting element 119b according to the second comparative example, the highly reflective insulating layer 60 is provided in a region except the n-side electrode 40 and the p-side electrode 50 and in the peripheral region of the element. Then, the n-side pad layer 41 is provided on a part of the highly reflective insulating layer 60 while covering the n-side electrode 40. In this case, the area of the region of the n-side electrode 40 in contact with the n-type semiconductor layer 10 (facing region) is larger than the area in the region of the highly reflective insulating layer 60 sandwiched by the n-type semiconductor layer 10 and the n-side pad layer 41.

Namely, the area of the n-side electrode 40 having a low reflectance is larger than the area of the highly reflective insulating layer 60. This causes a low extraction efficiency of the light in the semiconductor light emitting element 119b.

In the semiconductor light emitting element 119b according to this comparative example, the highly reflective insulating layer 60 is provided also in the peripheral region of the element and a region adjacent to the p-side electrode 50. As described later, also in the semiconductor light emitting element according to this embodiment, the highly reflective insulating layer 60 can be provided in these regions. Accordingly, when the semiconductor light emitting element 119b according to the comparative example is compared with the semiconductor light emitting element 110, comparison is only made about the region of the n-side electrode 40. In this comparison, the semiconductor light emitting element 119b according to this comparative example has the light extraction efficiency relatively lower than that of the semiconductor light emitting element 110.

Third Comparative Example

Figure 4A:
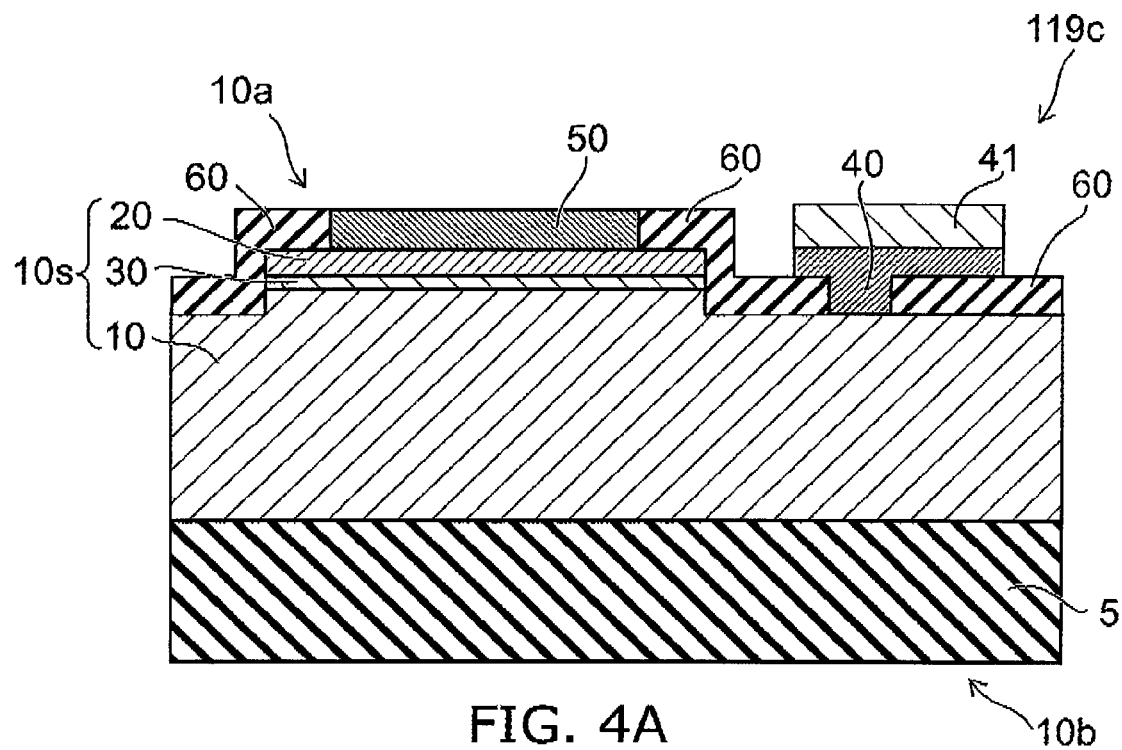
FIGS. 4A and 4B are schematic views illustrating a semiconductor light emitting element according to a third comparative example.
Figure 4B:
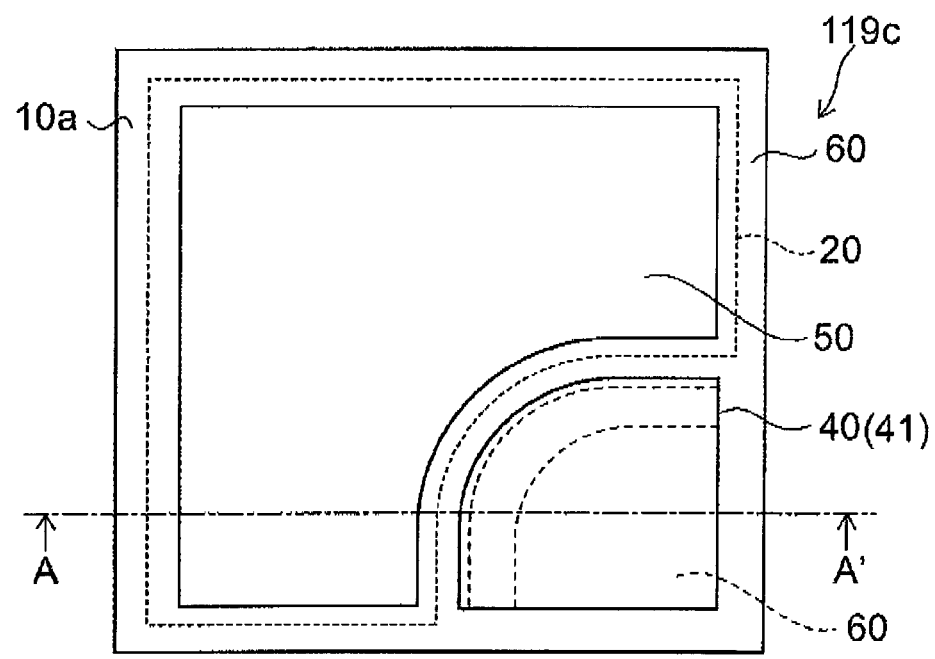

FIGS. 4A and 4B are schematic views illustrating the structure of a semiconductor light emitting element according to a third comparative example.

Namely, FIG. 4B is a schematic plan view, and FIG. 4A is a cross-sectional view taken along line A-A' in FIG. 4B.

As shown in FIGS. 4A and 4B, a semiconductor light emitting element 119c according to the third comparative example has an increased region of the highly reflective insulating layer 60 in the vicinity of the n-side electrode 40 compared with the semiconductor light emitting element 119b according to the second comparative example. Accordingly, the area of the region of the n-side electrode 40 in contact with the n-type semiconductor layer 10 (facing region) is smaller than the area of the region of the highly reflective insulating layer 60 in contact with the n-type semiconductor layer 10 (facing region). However, in this case, the n-side pad layer 41 is provided only on the n-side electrode 40, and the n-side pad layer 41 is not provided on the highly reflective insulating layer 60.

The semiconductor light emitting element 119c according to this comparative example having such a configuration has a reduced area in which the n-side electrode 40 having a low reflectance contacts the n-type semiconductor layer 10 and an increased area of the highly reflective insulating layer 60. This causes high light extraction efficiency. On the other hand, the n-side pad layer 41 is not provided on the highly reflective insulating layer 60, and the area of the n-side pad layer 41 is small. This causes poor mountability, resulting in difficulties in miniaturization of the element, a reduced yield, and deteriorated productivity, for example. Moreover, the material used for the n-side electrode 40 and the sintering conditions need to satisfy good ohmic properties with the n-type semiconductor layer 10, adhesion to the highly reflective insulating layer 60, and no diffusion of a part of the material of the highly reflective insulating layer 60 to the n-side electrode 40 even when sintering is performed on the n-side electrode 40 contacting the highly reflective insulating layer 60. Accordingly, severe restrictions are imposed on the material used for the n-side electrode 40 and the sintering conditions. As a result, the n-side electrode 40 cannot obtain sufficient high ohmic properties with the n-type semiconductor layer 10. When the area of the n-side electrode 40 is increased in order to reduce the operating voltage, the light extraction efficiency deteriorates.

Fourth Comparative Example

Figure 5A:
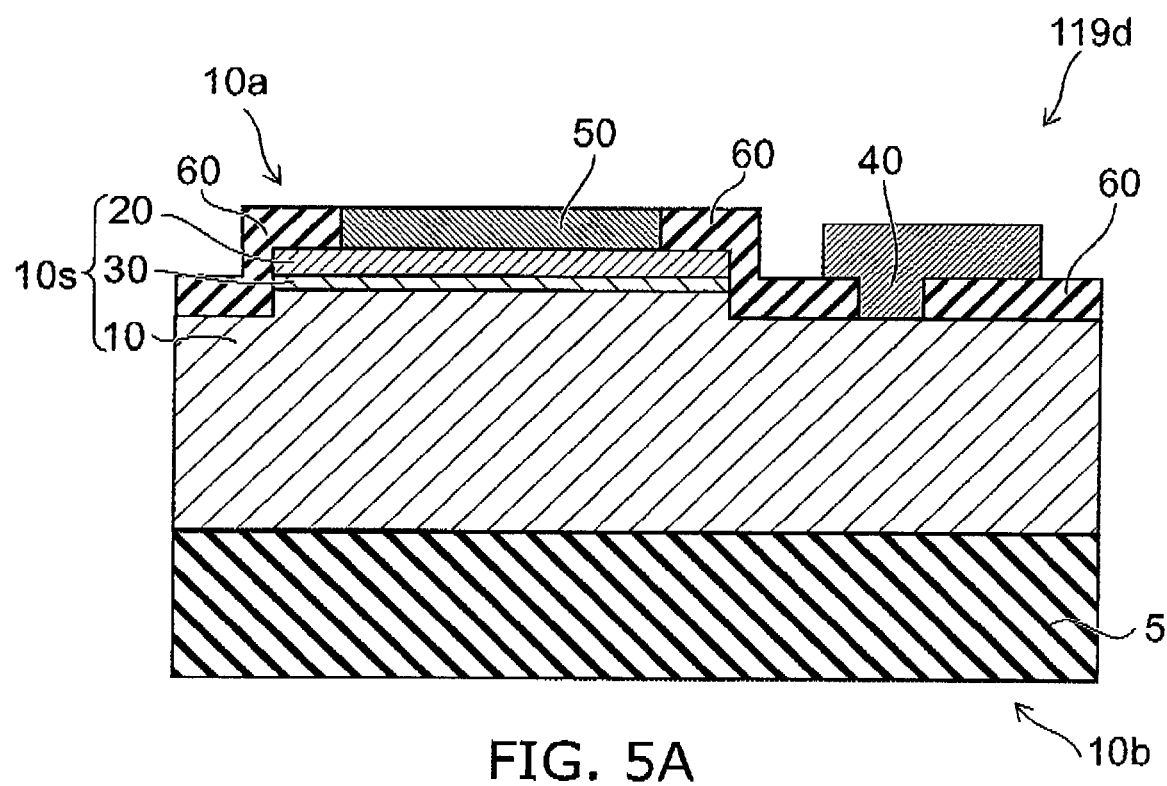
FIGS. 5A and 5B are schematic views illustrating a semiconductor light emitting element according to a fourth comparative example.
Figure 5B:
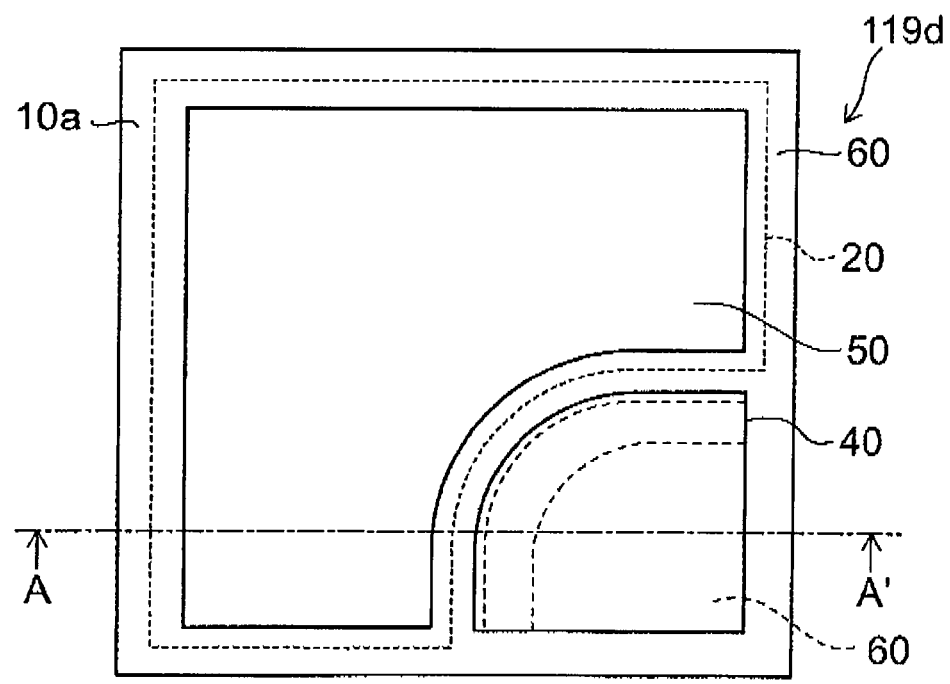

FIGS. 5A and 5B are schematic views illustrating the structure of a semiconductor light emitting element according to a fourth comparative example.

Namely, FIG. 5B is a schematic plan view, and FIG. 5A is a cross-sectional view taken along line A-A' in FIG. 5B.

As shown in FIGS. 5A and 5B, a semiconductor light emitting element 119d according to the fourth comparative example does not have the n-side pad layer 41 in the semiconductor light emitting element 119c according to the third comparative example. The structure of the first main surface 10a of the semiconductor light emitting element 119d is similar to that disclosed in JP-A 2007-324585 (Kokai).

The semiconductor light emitting element 119d according to the comparative example having such a configuration has a reduced area in which the n-side electrode 40 having a low reflectance contacts the n-type semiconductor layer 10 and an increased area of the highly reflective insulating layer 60. This causes high light extraction efficiency. However, the n-side pad layer 41 is not provided on the n-side electrode 40, and the connecting member such as a gold bump and bonding wire contacts the n-side electrode 40 directly.

Accordingly, the material used for the n-side electrode 40 and the sintering conditions need to satisfy good ohmic properties with the n-type semiconductor layer 10, adhesion to the connecting member such as a gold bump and bonding wire, resistance against diffusion of various elements included in the connecting member, and resistance against increase in a temperature during a process to mount the connecting member. For this demand, severe restrictions are imposed on the material used for the n-side electrode 40 and the sintering conditions to narrow a selection range of the material and the sintering conditions. As a result, the n-side electrode 40 cannot obtain sufficiently high ohmic properties with the n-type semiconductor layer 10. Thus, in the semiconductor light emitting element 119d according to the comparative example, the operating voltage increases when reliability is sufficiently secured. The light extraction efficiency deteriorates when the area of the n-side electrode 40 is increased.

On the other hand, as already described, in the semiconductor light emitting element 110 according to this embodiment, use of the lamination layer structure formed of the n-side electrode 40 and the n-side pad layer 41 relieves the demand for the material used for the n-side electrode 40 so that a material having good ohmic properties can be used. In addition, the area of the n-side electrode 40 can be reduced to a necessary minimum, the area of the highly reflective insulating layer 60 is increased as large as possible, and the area of the n-side pad layer 41 provided thereon can be increased. Thereby, it is possible to provide the semiconductor light emitting element having enhanced mountability, reduced operating voltage, and high light extraction efficiency while sufficiently ensuring reliability.

Figure 6A:
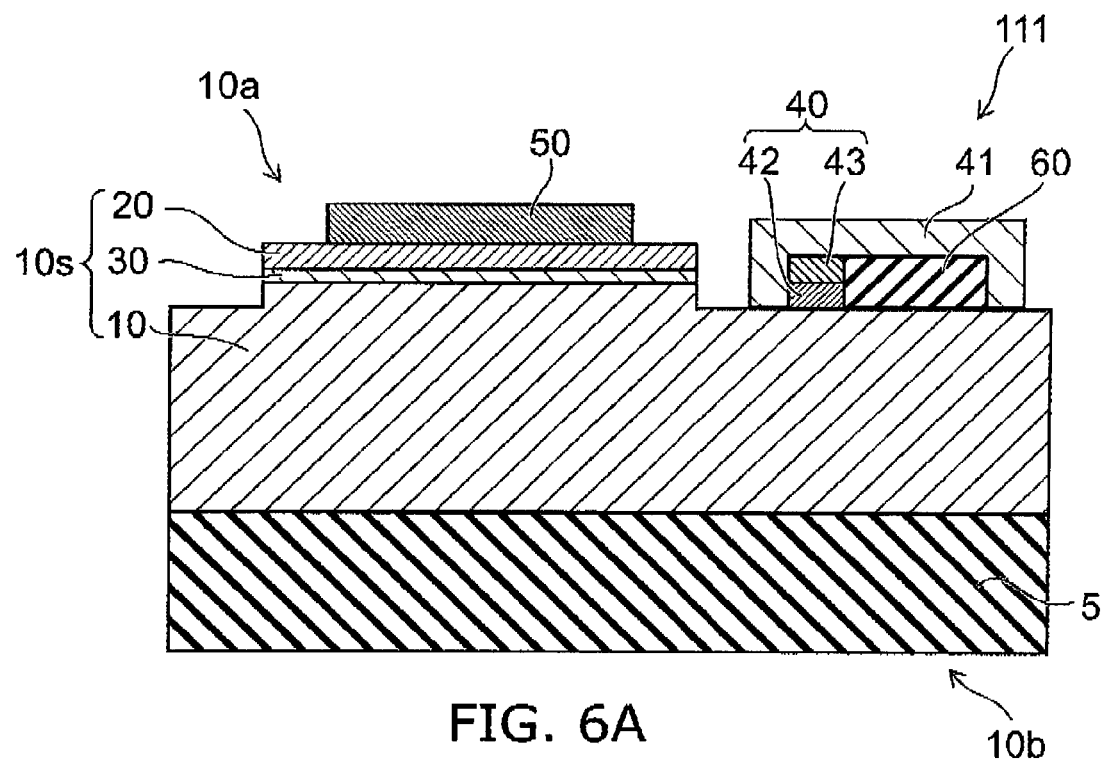
FIGS. 6A and 6B are schematic views illustrating another semiconductor light emitting element according to the embodiment.
Figure 6B:
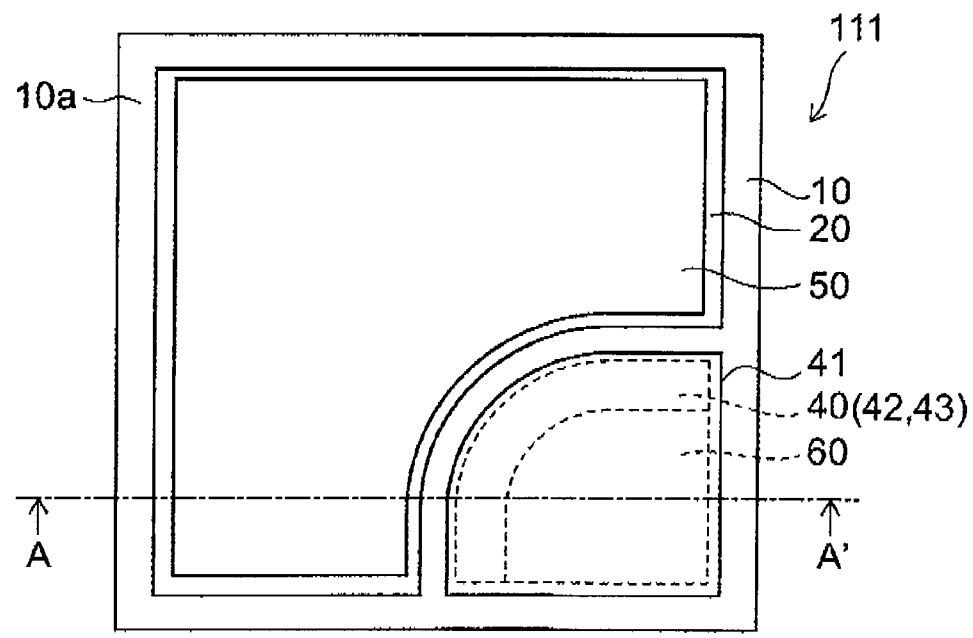

FIGS. 6A and 6B are schematic views illustrating the configuration of another semiconductor light emitting element according to the first embodiment of this invention.

Namely, FIG. 6B is a schematic plan view, and FIG. 6A is a cross-sectional view taken along line A-A' in FIG. 6B.

As shown in FIGS. 6A and 6B, in another semiconductor light emitting element 111 according to this embodiment, the n-side electrode 40 includes a transparent conductive film 42. In this specific example, the n-side electrode 40 has the transparent conductive film 42 and a reflective metal film 43. Except this, portions can be the same as those of the semiconductor light emitting element 110, and description thereof will be omitted.

The transparent conductive film 42 is provided in contact with the n-type semiconductor layer 10. The reflective metal film 43 is provided on the transparent conductive film 42 on a side opposite to the n-type semiconductor layer 10. Namely, for example, the reflective metal film 43 is provided between the transparent conductive film 42 and the n-side pad layer 41.

The transparent conductive film 42 has translucency to the light emitted from the light emitting layer 30. A material having good ohmic properties with the n-type semiconductor layer can be used for the transparent conductive film 42.

On the other hand, the reflective metal film 43 can be provided so as not to contact the n-type semiconductor layer 10. Accordingly, the reflective metal film 43 may just satisfy a property of a high reflectance as long as conduction of current between the n-side pad layer 41 and the transparent conductive film 42 is possible.

Thus, the n-side electrode 40 in the semiconductor light emitting element 111 is provided on the n-type semiconductor layer 10 side and includes the transparent conductive film 42 having translucency to the light emitted from the light emitting layer 30.

A film made of a material having a band gap larger than the wavelength of the emitting light transmitted can be used for the transparent conductive film 42. Alternatively, a metal film whose thickness is sufficiently thinner than that determined by the inverse number of an absorption coefficient in the wavelength of the emitting light transmitted can be used. A transparent conductive layer including at least one of nickel, indium tin oxide, and zinc oxide, for example, can be used for the transparent conductive film 42.

The reflective metal film 43 includes at least a metal film having high reflection properties to the emitting light. Silver or aluminum, which is a metal showing high reflectivity to the emitting light at 370 to 400 nm, can be used as the reflective metal film 43.

The entire reflective metal film 43 can be covered with the n-side pad layer 41, allowing a configuration in which a gold bump and the like are formed so as not to contact the reflective metal film 43. Accordingly, adhesion demanded of the reflective metal film 43 is more relieved than that demanded of the p-side electrode 40 and the n-side pad layer 41.

The transparent conductive film 42 has the following roles: a role of transmitting the light from the light emitting layer 30 reflected within the semiconductor light emitting element 111 to reflect the light by the reflective metal film 43; a role of contacting the n-type semiconductor layer 10 with good electrical properties; and a role of preventing a reaction of silver or aluminum used in the reflective metal film 43 with the n-type semiconductor layer 10 or diffusion of silver or aluminum within the n-type semiconductor layer 10. For this reason, preferably, the planar shape of the transparent conductive film 42 is substantially the same as the planar shape of the reflective metal film 43.

The thickness of the transparent conductive film 42 is arbitrary and is between 1 nm to 500 nm, for example.

According to the semiconductor light emitting element 111 having such a configuration, a transparent conductive film 42 having good ohmic properties is disposed on the n-type semiconductor layer 10 side of the n-side electrode 40, and the reflective metal film 43 having conductivity and reflectivity is disposed on the transparent conductive film 42. This allows compatibility of high ohmic properties and high reflectance and also can improve reliability.

The n-side electrode 40 may not have the reflective metal film 43, and the entire n-side electrode 40 may be the transparent conductive film 42. Namely, the n-side electrode 40 may be a transparent conductive film that includes at least one of nickel, indium tin oxide, and zinc oxide, electrically contacts the n-type semiconductor layer 10 and the n-side pad layer 41, and has translucency to the light emitted from the light emitting layer 30. In this case, the light that passes through the n-side electrode 40 is reflected by the n-side pad layer 41, advances to the laminated structure body 10s side, and is extracted to the outside.

Figure 7A:
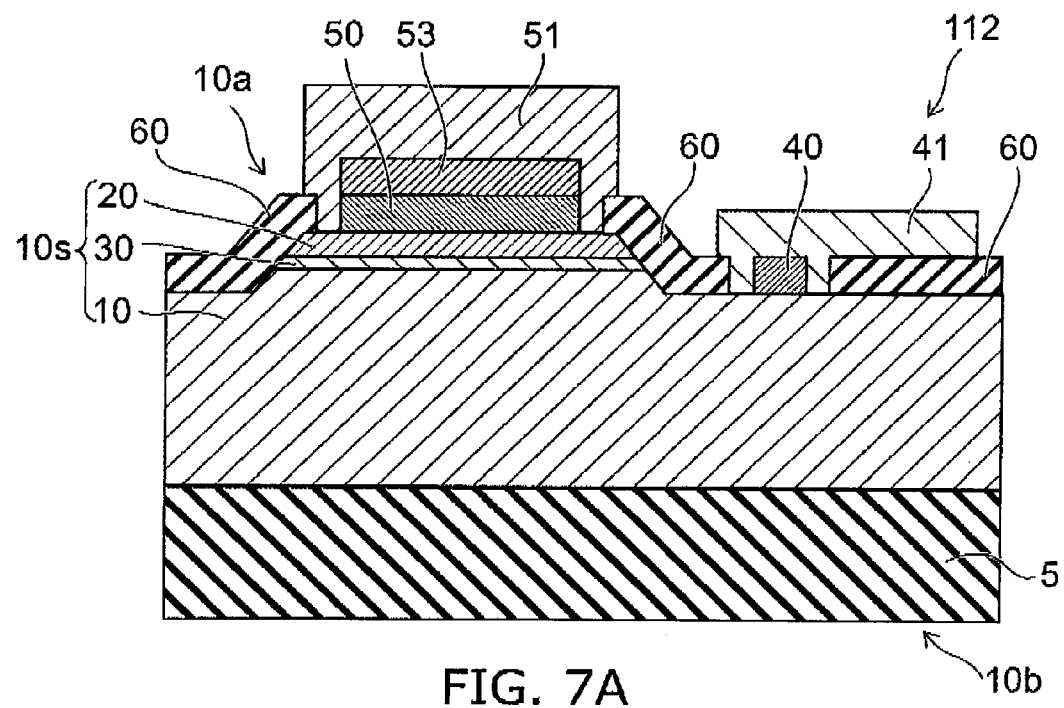
FIGS. 7A and 7B are schematic views illustrating another semiconductor light emitting element according to the embodiment.
Figure 7B:
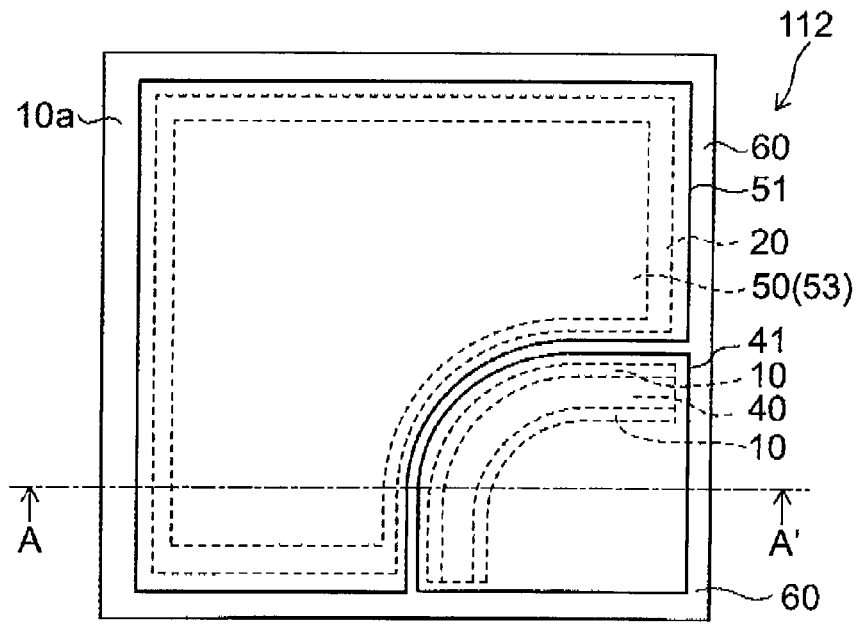

FIGS. 7A and 7B are schematic views illustrating the configuration of another semiconductor light emitting element according to the first embodiment of this invention.

Namely, FIG. 7B is a schematic plan view, and FIG. 7A is a cross-sectional view taken along line A-A' in FIG. 7B.

As shown in FIGS. 7A and 7B, in a semiconductor light emitting element 112 according to this embodiment, the n-type semiconductor layer 10 and the p-type semiconductor layer 20 on the first main surface 10a of the laminated structure body 10s are covered with the highly reflective insulating layer 60 (for example, a dielectric laminated film) except a part of an opening. A diffusion prevention layer 53 is provided on the p-side electrode 50, and a p-side pad layer 51 is provided thereon. The p-type semiconductor layer 20 and the light emitting layer 30 on the first main surface 10a of the laminated structure body 10s have a mesa portion having a sloped tapered portion. Except this, portions can be the same as those of the semiconductor light emitting element 110, and description thereof will be omitted.

Such a semiconductor light emitting element 112 is manufactured, for example, as follows. Namely, similarly to the semiconductor light emitting element 110, the laminated structure body 10s is formed, and subsequently, the p-type semiconductor layer 20 and the light emitting layer 30 are removed so as to expose the n-type contact layer to the surface. The etching treatment at this time is performed so that the mesa portion of the laminated structure body 10s has a tapered shape whose inclination from the normal of the first main surface 10a is approximately 70 degrees, for example.

Subsequently, using a thermal CVD system, a $SiO_2$ film serving as a dielectric film is formed in a thickness of 200 nm on the first main surface 10a of the laminated structure body 10s.

Next, a patterned resist for lift-off is formed on an n-type contact layer (for example, the aforementioned Si-doped n-type GaN contact layer), and a part of the $SiO_2$ film on the exposed n-type contact layer is removed by ammonium hydrogen fluoride treatment, for example. Using a vacuum evaporation apparatus, a Ti/Al/Ni/Au laminated film serving as the n-side electrode 40 having a thickness of 300 nm, for example, is formed in the region from which the $SiO_2$ film is removed. After lifting off the resist for lift-off, the sintering treatment is performed under a nitrogen atmosphere at 650° C. Thereby, the n-side electrode 40 is formed. The width of the n-side electrode 40 is 10 μm.

Next, in order to form the p-side electrode 50, a patterned resist for lift-off is formed on a p-type contact layer (for example, the aforementioned heavily Mg-doped p-type GaN contact layer), and ammonium hydrogen fluoride treatment is performed to expose the p type contact layer. At that time, a time of the ammonium hydrogen fluoride treatment is adjusted so that the p type contact layer may be exposed between the p-side electrode 50 and the $SiO_2$ film of a dielectric film. Specifically, the total time of a time for removing the $SiO_2$ film in the region where the p-side electrode 50 is formed and a time of over etching to expose the p type contact layer located immediately next to the aforementioned region in width of 1 μm is approximately 3 minutes at an etching rate of 400 nm/min., for example. Using a vacuum evaporation apparatus, an Ag/Pt laminated film having a thickness of 200 nm, for example, is formed in the region from which the $SiO_2$ film is removed. After lifting off, a sintering treatment is performed under an oxygen atmosphere at 350° C.

Next, by a lift-off method, five combinations of a Pt film and a W film are formed as the diffusion prevention layer 53 so as to cover the p-side electrode 50. The total thickness of the diffusion prevention layer 53 is 600 nm, for example.

Next, a dielectric laminated film serving as the highly reflective insulating layer 60 is formed on the p type semiconductor layer 20 where the p-side electrode 50 is not formed, and on the dielectric film of the n-type semiconductor layer 10. For example, five combinations of a $SiO_2$ film and a $TiO_2$ film are laminated. However, the dielectric laminated film may be removed in the periphery of the element, or the dielectric laminated film may be damaged by an isolation process or the like in the periphery of the element.

In FIGS. 7A and 7B, although the highly reflective insulating layer 60 does not contact the p-side electrode 50 and the n-side electrode 40, a part of the highly reflective insulating layer 60 may overlap the top of the p-side electrode 50 or the n-side electrode 40.

Then, a Ti/Pt/Au laminated film serving as the n-side pad layer 41 and the p-side pad layer 51 is formed so as to cover a part of the highly reflective insulating layer 60 while covering the p-side electrode 50 and the n-side electrode 40. The lift-off method is used for this formation, for example. The thickness of the highly reflective insulating layer 60 is 1000 nm, for example.

Then, the laminated structure body 10s is cut by a cleavage or a diamond blade to separate individual elements. Thus, the semiconductor light emitting element 112 is manufactured. The size of the semiconductor light emitting element 112 is a square of 300 μm in length, for example.

In the aforementioned process, before the p-side electrode 50 and the n-side electrode 40 as an ohmic metal are formed, the dielectric film (the above-mentioned $SiO_2$ film) is formed in the semiconductor layer of the laminated structure body 10s. Thereby, contamination that adheres to an interface between the electrode and the semiconductor layer in an electrode formation process can be significantly reduced, therefore allowing improvement in reliability, a yield, electrical properties, and optical properties.

When the n-side electrode 40 has a low reflectance and the region excluding the n-side electrode 40 and including the p-side electrode 50 has a high reflectance, it is desirable that the distance between the p-side electrode 50 and the n-side electrode 40 is formed slightly larger because the light emitted directly under the p-side electrode 50 facing the n-side electrode 40 is reflected by an interface between the substrate 5 made of sapphire and the crystal layer and immediately reaches to the n-side electrode 40 to be absorbed.

For example, when the width of the n-side electrode 40 is 10 μm, the proportion of the area of the n-side electrode 40 on an electrode formation surface (the first main surface 10a) of the semiconductor light emitting element 112 is approximately 13% in the semiconductor light emitting element 119a according to the first comparative example. On the other hand, the proportion of the area of the n-side electrode 40 is approximately 2% in the semiconductor light emitting element 112 according to this specific example, and the proportion of the area of the n-side electrode 40 can be significantly reduced. Thus, according to the semiconductor light emitting element 112, the light absorbing region can be significantly reduced. In addition, by forming the highly reflective insulating layer 60 in the reduced absorbing area, the reflection region can be increased to further improve the light extraction efficiency.

The p-side electrode 50 is covered with the diffusion prevention layer 53 and the p-side pad layer 51 to be isolated from open air. Accordingly, the p-side electrode 50 is hard to be exposed to moisture or ion impurities so that migration, oxidization, sulfuration reaction in the p-side electrode 50 can be suppressed.

Moreover, the p-side pad layer 51 is formed closely contacting the end of the p-side electrode 50 on the side in which the p-side electrode 50 and the n-side electrode 40 face each other. The current path is formed closely contacting the p-side electrode 50 to relieve current concentration on the p-side electrode 50.

Simultaneously, a region sandwiched by the p-type semiconductor layer 20 and the p-side pad layer 51 is formed in the vicinity of the end of the region where the p-side electrode 50 faces the dielectric film (the aforementioned $SiO_2$ film) and in the vicinity the end of the region where the p-side electrode 50 faces the highly reflective insulating layer 60, respectively. Accordingly, a weak electric field is applied between the p-type semiconductor layer 20 and the p-side pad layer 51 through the dielectric film or the highly reflective insulating layer 60. As a result, a structure where the electric field becomes gradually weak from the p-side electrode 50 to the dielectric film or the highly reflective insulating layer 60 can be provided to relieve the electric field concentration on this region.

The semiconductor light emitting element according to this embodiment needs no special device in the manufacturing process and can be formed with the same process and the number of the process as those in the past. These effects can bring reduced leakage current, improved insulating properties, improved breakdown voltage properties, improved luminescence intensity, increased life span, high throughput, and low cost of the semiconductor light emitting element.

When the length of which the p-side pad layer 51 covers the dielectric film or the highly reflective insulating layer 60 is long, it is advantage in obtaining the structure to relieve the electric field via the dielectric film or the highly reflective insulating layer 60. However, a risk of a short of the p-side electrode 50 and the n-side electrode 40 is increased. On the other hand, when the length is short, the risk of a short of the p-side electrode 50 and the n-side electrode 40 is decreased.

The reflection region can be significantly increased by forming the highly reflective insulating layer 60 in approximately all the region of the first main surface 10a in which the p-side electrode 50 and the n-side electrode 40 are not formed. This can improve the light extraction efficiency.

The tapered shape can prevent disconnection of the dielectric film and the highly reflective insulating layer 60 when the n-type semiconductor layer 10 is exposed.

The highly reflective insulating layer 60 formed on the tapered sloped surfaces has a thickness thinner than that of the highly reflective insulating layer 60 formed on a parallel surface (the surface parallel to the first main surface 10a). Accordingly, when the thickness of each layer to the emitting light is optically designed on the parallel surface, the conditions on the tapered sloped surface are deviated from the optical design so that reflectivity in the region deteriorates. By making the taper angle small (making an angle between the first main surface 10a and the sloped surface small), the thickness of each film included in the highly reflective insulating layer 60 formed on the sloped surfaces approaches the thickness of the flat surface. Then, reflectivity close to that of the optical design is obtained also on the sloped surfaces. From a viewpoint of the light extraction efficiency, an optimal taper angle varies depending on the shape of the semiconductor light emitting element or the shape of the p-side electrode 50. The taper angle can be determined in consideration of these.

The diffusion prevention layer 53 provided between the p-side electrode 40 and the p-side pad layer 51 suppresses substances included in the p-side pad layer 51 from being diffused toward the p-side electrode 50 or the substances from reacting with a material included in the p-side electrode 50. For this purpose, a material that does not react with silver used for the p-side electrode 50 or is not actively diffused to silver can be used for the diffusion prevention layer 53. A single layer film or a laminated film including high melting point metals, such as vanadium (V), chromium (Cr), iron (Fe), cobalt (Co), nickel (Ni), niobium (Nb), molybdenum (Mo), ruthenium (Ru), rhodium (Rh), tantalum (Ta), tungsten (W), rhenium (Re), iridium (Ir), platinum (Pt), for example, can be used for the diffusion prevention layer 53.

More desirably, to avoid problems even if some are diffused, iron (Fe), cobalt (Co), nickel (Ni), rhodium (Rh), tungsten (W), rhenium (Re), iridium (Ir), and platinum (Pt) are used for the diffusion prevention layer 53 as a metal having high work function and being easy to provide ohmic properties with the p-GaN contact layer (for example, the aforementioned heavily Mg-doped p-type GaN contact layer).

In the case of a single layer film, the thickness of the diffusion prevention layer 53 is desirably 5 nm to 200 nm so that a film state may be maintained. In the case of a laminated film, the thickness is not limited in particular, and can be selected between 10 nm and 10000 nm, for example.

Next, a variation of the semiconductor light emitting element according to this embodiment will be described.

FIGS. 8A to 8D are schematic plan views illustrating the configurations of other semiconductor light emitting elements according to the first embodiment of this invention.

Namely, FIGS. 8A to 8D show the configurations of other semiconductor light emitting elements 113 to 116 according to this embodiment and are schematic plan views when viewed from the laminating direction of the laminated structure body 10s of the semiconductor light emitting element.

In these semiconductor light emitting elements 113 to 116, the n-side electrode 40 is disposed not in a corner of the first main surface 10a of the laminated structure body 10s but in the central portion of a side of the first main surface 10a. In this case as well, the area of the region of the n-side electrode 40 in contact with the n-type semiconductor layer 10 (facing region) is smaller than the area of the region of the highly reflective insulating layer 60 sandwiched between the n-type semiconductor layer 10 and the n-side pad layer 41. Thereby, in the semiconductor light emitting elements 113 to 116 as well, a semiconductor light emitting element having low operating voltage, high light extraction efficiency, high mountability, high throughput, and high reliability can be provided.

Figures 8A, 8B:
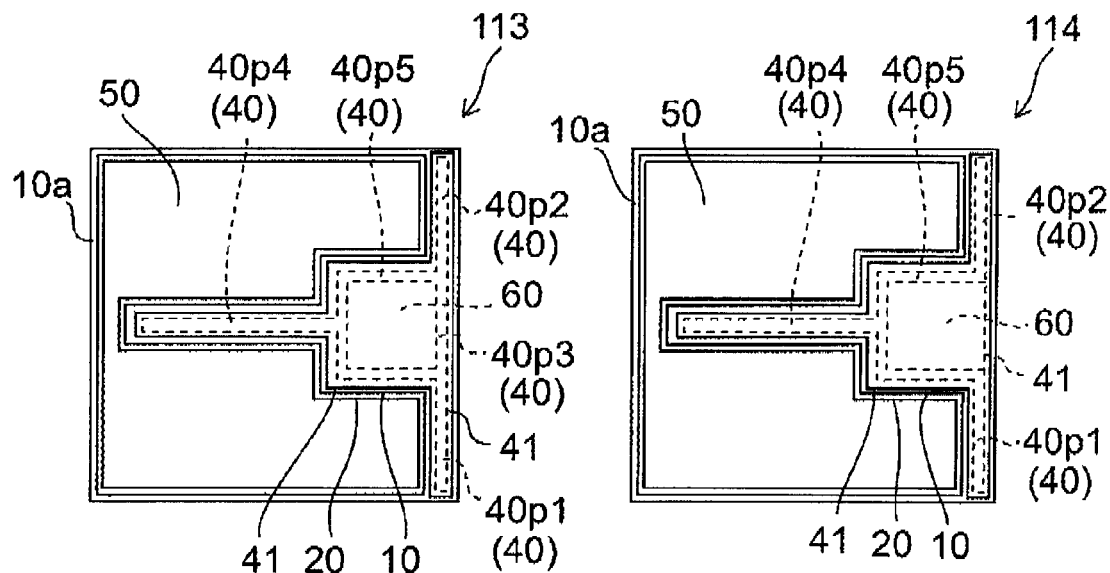
FIGS. 8A to 8D are schematic plan views illustrating other semiconductor light emitting elements according to the embodiment.

As shown in FIG. 8A, in the semiconductor light emitting element 113, the p-side electrode 50 has a planar shape with a recess. This recess is provided in the central portion of the first main surface 10a. The n-side electrode 40 has a first side part 40p1 along one side of the first main surface 10a of the laminated structure body 10s, a second side part 40p2, and a third side part 40p3 between the first side part 40p1 and the second side part 40p2. The n-side electrode 40 also has a central extended part 40p4 along the recess of the p-side electrode 50 and a central part 40p5 that connects the first side part 40p1, the second side part 40p2, and the central extended part 40p4.

Then, the highly reflective insulating layer 60 is provided in a region surrounded by the third side part 40p3 and the central part 40p5.

The n-side pad layer 41 is provided so as to cover the first side part 40p1, the second side part 40p2, the third side part 40p3, central extended part 40p4 and the central portion 40p5 of the n-side electrode 40 and the highly reflective insulating layer 60. A gold bump or a bonding wire is provided on the n-side pad layer 41 in a region on the highly reflective insulating layer 60.

In the semiconductor light emitting element 113 as well, the n-side electrode 40 is provided in a portion facing the p-side electrode 50 in the n-type semiconductor layer 10. Thereby, electrical properties can be improved effectively to reduce the operating voltage.

As shown in FIG. 8B, in the semiconductor light emitting element 114, the third side part 40p3 in the configuration of the semiconductor light emitting element 113 is omitted, and the highly reflective insulating layer 60 is provided in the region. A portion that does not face the p-side electrode 50 in the n-side electrode 40 contributes little to electrical conduction of current and exerts little influence on the electrical properties. Accordingly, even if the third side part 40p3 is not provided, the electrical properties hardly change. Then, omission of the third side part 40p3 can further increase the area of the highly reflective insulating layer 60 and can further increase the region having a high reflectance so that the light extraction efficiency further improves.

Figures 8C, 8D:
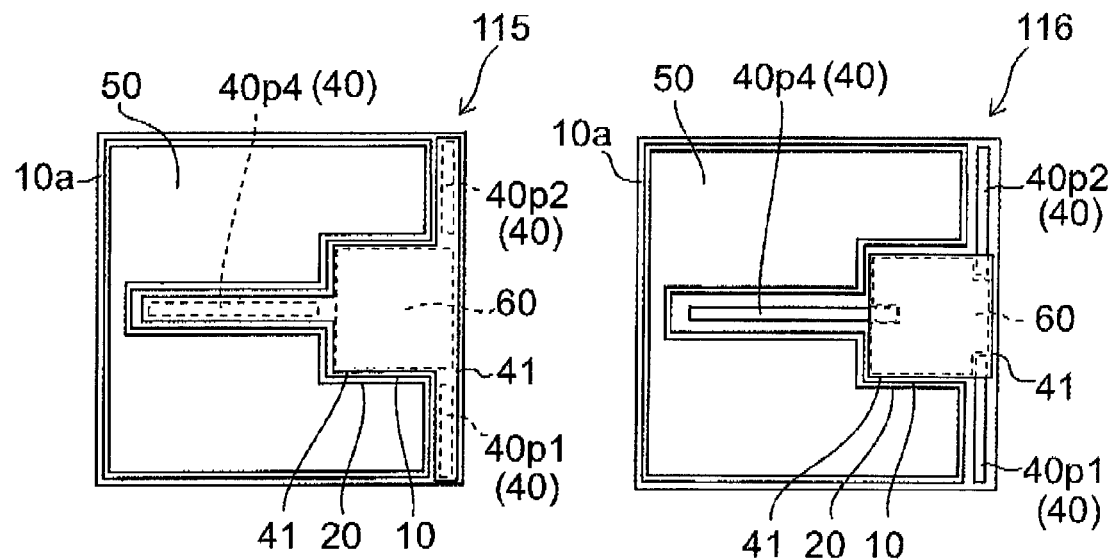

As shown in FIG. 8C, in the semiconductor light emitting element 115, the central part 40p5 in the configuration of the semiconductor light emitting element 114 is also omitted, and the n-side electrode 40 has the first side part 40p1, the second side part 40p2, and the central extended part 40p4. The first side part 40p1, the second side part 40p2, and the central extended part 40p4 are covered with the n-side pad layer 41, thereby to connect the first side part 40p1, the second side part 40p2, and the central extended part 40p4 to each other. The first side part 40p1, the second side part 40p2, and the central extended part 40p4 are also electrically connected to a gold bump and a bonding wire via the n-side pad layer 41.

In the semiconductor light emitting element 115, omission of the third side part 40p3 and the central portion 40p5 can further increase the area of the highly reflective insulating layer 60 and can further increase the region having a high reflectance so that the light extraction efficiency further improves. The light extraction efficiency can be Improved without changing the electrical properties much by appropriately designing the lengths of portions of the first side part 40p1, the second side part 40p2, and the central extended part 40p4 facing the p-side electrode 50.

As shown in FIG. 8D, in the semiconductor light emitting element 116 as well, the n-side electrode 40 has the first side part 40p1, the second side part 40p2, and the central extended part 40p4. The highly reflective insulating layer 60 is provided on the n-type semiconductor layer 10 of a region in which the first side part 40p1, the second side part 40p2, and the central extended part 40p4 are not provided. The n-side pad layer 41 is provided on the highly reflective insulating layer 60. Then, each part of the first side part 40p1, the second side part 40p2 and the central extended part 40p4, and the highly reflective insulating layer 60 are covered with the n-side pad layer 41. In other words, in this specific example, each part of the first side part 40p1, the second side part 40p2 and the central extended part 40p4 are not covered with the n-side pad layer 41.

In this case as well, omission of the third side part 40p3 and the central portion 40p5 can further increase the area of the highly reflective insulating layer 60 and can further increase the region having a high reflectance so that the light extraction efficiency further improves.

In the semiconductor light emitting element 116 according to the specific example, the n-side electrode 40 not covered with the n-type pad layer 41 is preferably covered with the highly reflective insulating layer 60 from a viewpoint of reliability and a mounting process. Thereby, a design margin of the periphery of the n-side electrode 40 is increased. As a result, improvement in the light extraction efficiency by increasing the area of the p-side electrode 40 and improvement in throughput by increasing a margin of alignment accuracy at the time of forming the n-side electrode 40 can be expected.

In the semiconductor light emitting device according to this embodiment, the region in which the n-side pad layer 41 is provided has a shape whose length and width are relatively close to each other, such as a square or a rectangular or ellipse form relatively closer to a circle, as in the semiconductor light emitting devices 111 to 116. A ratio of the peripheral length to the area of the n-side pad layer 41 is relatively small. On the other hand, in order to effectively feed current in the portion facing the p-side electrode 50, the n-side electrode 40 has a shape aligned with the edges of the p-side electrode 50, and a ratio of a peripheral length to the area of the n-side electrode 40 is relatively large. Thus, the planar shape of the n-side pad layer 41 has a block shape, and the planar shape of the n-side electrode 40 has a shape having branches extended from the block.

Figure 9:
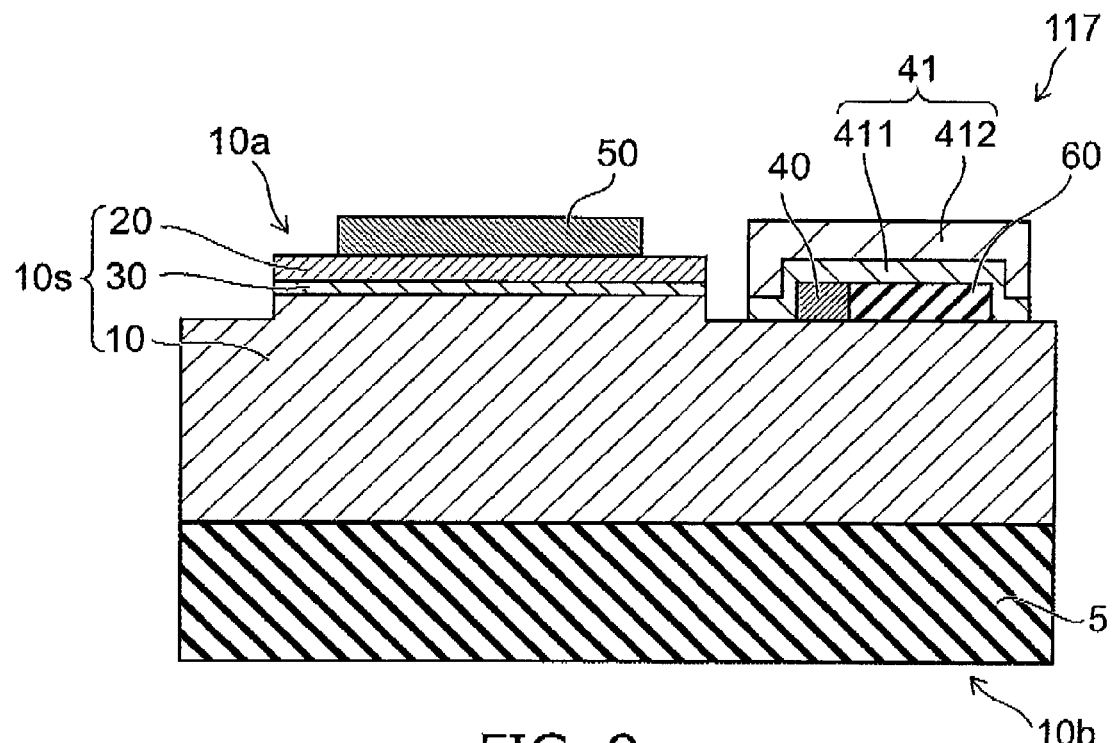
FIG. 9 is a schematic cross-sectional view illustrating another semiconductor light emitting element according to the embodiment.

FIG. 9 is a schematic cross-sectional view illustrating the configuration of another semiconductor light emitting element according to the first embodiment of this invention.

As shown in FIG. 9, in a semiconductor light emitting element 117 according to this embodiment, the n-side pad layer 41 has a plurality of layers of a first n-side pad layer 411 and a second n-side pad layer 412 laminated on the first n-side pad layer 411. Except this, portions can be the same as those in the semiconductor light emitting element 110, and description thereof will be omitted.

The first n-side pad layer 411 is provided on the side of the n-side electrode 40 and the highly reflective insulating layer 60. The first n-side pad layer 411 may have reflectance to the emitting light higher than that of the second n-side pad layer 412. A material used for the first pad layer 411 is selected by placing importance on at least one of reflectance and adhesion to the highly reflective insulating layer 60. For example, Ag and Al can be used for the first pad layer 411. Furthermore, a heat treatment may be performed to improve adhesion between the first n-side pad layer 411 and the highly reflective insulating layer 60.

On the other hand, a material used for the second pad layer 412 is selected by placing importance on adhesion to the connecting member such as a gold bump and a bonding wire, resistance against diffusion of various elements included in the connecting member, resistance against increase in a temperature during the mounting process to the connecting member, and the like. For example, Au is used for the second pad layer 412.

The n-type pad layer 41 has such a laminated layer structure of the first n-side pad layer 411 and the second n-side pad layer 412 so that performance demanded of the lower part and that demanded of the upper part of the n-side pad layer 41 can be separated, and the highest performance can be demonstrated. Thereby, the mountability, the operating properties, and the light extraction efficiency can be further improved.

The configuration in which the n-side pad layer 41 has the laminated layer structure can also be applied to all of the semiconductor light emitting elements according to the already described embodiments of this invention, and the same effect can be obtained.

Second Embodiment

A semiconductor light emitting device of this invention is a semiconductor light emitting device using a semiconductor light emitting element according to the first embodiment. Here, while any of the semiconductor light emitting elements according to the first embodiment can be used for this semiconductor light emitting element, an example using the semiconductor light emitting element 110 will be described below.

Figure 10:
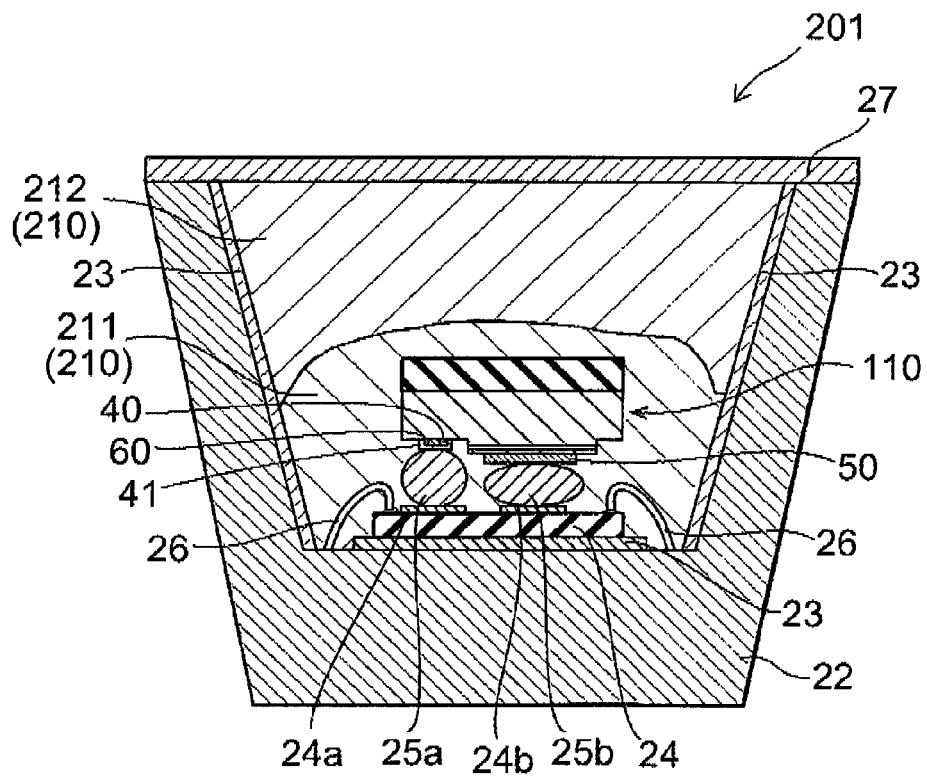
FIG. 10 is a schematic cross-sectional view illustrating a semiconductor light emitting device according to an embodiment.

FIG. 10 is a schematic cross-sectional view illustrating the configuration of a semiconductor light emitting device according to a second embodiment of this invention.

As shown in FIG. 10, a semiconductor light emitting device 201 according to this embodiment includes the semiconductor light emitting element 110 and a submount 24 (mounting component) on which the semiconductor light emitting element 110 is mounted.

The submount 24 has a plurality of mounting electrodes. In the specific example, the submount 24 has an n-side mounting electrode 24a (first mounting electrode) and a p-side mounting electrode 24b (second mounting electrode).

The first main surface 10a of the semiconductor light emitting element 110 is disposed facing the submount 24. The n-side pad layer 41 is electrically connected to one of the mounting electrodes of the submount 24, and the p-side electrode 50 is electrically connected to the other of the mounting electrodes of the submount 24. Namely, for example, the n-side pad layer 41 is electrically connected to the n-side mounting electrode 24a, and the p-side electrode 50 is electrically connected to the p-side mounting electrode 24b.

In other words, the semiconductor light emitting device 201 has a configuration in which the semiconductor light emitting element 110 is mounted by a flip chip method.

The semiconductor light emitting device further includes a wavelength conversion layer 210 that absorbs the light emitted from the light emitting layer 30 of the semiconductor light emitting element 110 (first light) and emits light (second light) having a wavelength different from that of the light (the first light). A first fluorescent layer 211 and a second fluorescent layer 212 described later, for example, can be used for the wavelength conversion layer 210.

According to the semiconductor light emitting device 201 having such a configuration, use of the semiconductor light emitting element according to the embodiments of this invention can provide a flip chip type semiconductor light emitting device having high mountability, good operating properties (low operating voltage), and high light extraction efficiency. Additionally, providing the aforementioned wavelength conversion layer 210 can provide a light emitting device having desired color properties.

Hereinafter, a specific example of the semiconductor light emitting device 201 will be further described.

As shown in FIG. 10, in the semiconductor light emitting device 201 according to this embodiment, a reflecting film 23 is provided on an inner surface of a container 22 made of ceramics or the like. The reflecting film 23 is separately provided on the inner side surfaces and the bottom surface of the container 22. The reflecting film 23 is made of aluminum, for example. Among these, the semiconductor light emitting element 110 shown in FIG. 1 is installed on the reflecting film 23 provided on the bottom surface of the container 22 via the submount 24.

A first gold bump 25a and a second gold bump 25b are provided on the n-side pad layer 41 and the p-side electrode 50 (or p-side pad layer 51) of the semiconductor light emitting element 110, respectively, by a ball bonder. Thereby, the semiconductor light emitting element 110 is fixed onto the submount 24.

Namely, the n-side mounting electrode 24a and the p-side mounting electrode 24b insulated from each other are provided on the surface of the submount 24. The n-side pad layer 41 is electrically connected to the n-side mounting electrode 24a, the p-side electrode 50 is electrically connected to the p-side mounting electrode 24b, and the semiconductor light emitting element 110 is fixed onto the submount 24. The semiconductor light emitting element 110 may be directly fixed onto the submount 24 without using the first and second gold bumps 25a and 25b.

These semiconductor light emitting element 110, submount 24, and reflecting film 23 can be fixed using adhesion by an adhesive, solder, and the like.

The n-side mounting electrode 24a and the p-side mounting electrode 24b of the submount 24 are respectively connected by a bonding wire 26 to an electrode provided on the container 22 side, which is not shown. This connection is made in a portion between the reflecting film 23 on the inner side surfaces and the reflecting film 23 on the bottom surface.

A first fluorescent layer 211 including a red fluorescent body is provided so as to cover the semiconductor light emitting element 110 and the bonding wire 26. On this first fluorescent layer 211, a second fluorescent layer 212 including blue, green, or yellow fluorescent body is provided. On these fluorescent layers, a cover 27 made of a silicone resin is provided.

The first phosphor layer 211 includes a resin and a red fluorescent body dispersed in this resin.

As the red fluorescent body, for example, $Y_2O_3$, $YVO_4$, and $Y_2(P, V)O_4$ can be used as a base material, and trivalent Eu ($Eu^{3+}$) is included in this base material as an activation substance. Namely, $Y_2O_3:Eu^{3+}$, $YVO_4:Eu^{3+}$, and the like can be used as the red fluorescent body. The concentration of Eu3+ can be 1% to 10% in a mol concentration. As the base material for the red fluorescent body, LaOS and $Y_2(P, V)O_4$ can be used besides $Y_2O_3$ and $YVO_4$. $Mn^{4+}$ and the like can also be used besides $Eu^{3+}$. Particularly, absorption of the light at 380 nm increases by adding a small amount of Bi with trivalent Eu to the base material of $YVO_4$, resulting in further increased light emitting efficiency. As the resin, a silicone resin and the like can be used, for example.

The second fluorescent layer 212 includes the resin and at least one of the fluorescent bodies of blue, green and yellow dispersed in this resin. For example, a fluorescent body in combination with the blue fluorescent body and the green fluorescent body may be used, a fluorescent body in combination with the blue fluorescent body and the yellow fluorescent body may be used, or a fluorescent body in combination with the blue fluorescent body, the green fluorescent body, and the yellow fluorescent body may be used.

As the blue fluorescent body, $(Sr, Ca)_{10}(PO_4)_6Cl_2:Eu^{2+}$, $BaMg_2Al_{16}O_{27}:Eu^{2+}$, and the like can be used, for example.

As the green fluorescent body, $Y_2SiO_5:Ce^{3+}$ and $Tb^{3+}$ in which trivalent Tb is an emission center can be used, for example. In this case, excitation efficiency improves by transmitting energy to Tb ions from Ce ions. As the green fluorescent body, $Sr_4Al_{14}O_{25}:Eu^{2+}$ and the like can be used, for example.

As the yellow fluorescent body, $Y_3Al_5:Ce^{3+}$ and the like can be used, for example.

A silicone resin and the like can be used as the resin, for example.

Particularly, trivalent Tb has sharp light emission in the vicinity of 550 nm where luminosity factor is at the maximum, and a combination of trivalent Tb with trivalent Eu having sharp red light remarkably improves light emitting efficiency.

According to the semiconductor light emitting device 201 according to this embodiment, 380 nm ultraviolet light generated from the semiconductor light emitting element 110 is emitted to the substrate 5 side of the semiconductor light emitting element 110. The aforementioned fluorescent bodies included in each of the fluorescent layers can be efficiently excited by using also reflection in the reflecting film 23.

For example, the aforementioned fluorescent body having trivalent Eu or the like included in the first fluorescent layer 211 as an emission center can be converted into light having a narrow wavelength distribution in the vicinity of 620 nm to efficiently obtain red visible light.

The blue, green, and yellow fluorescent bodies included in the second fluorescent layer 212 can be also efficiently excited to obtain visible light of blue, green, and yellow efficiently.

As these mixed colors, white light and light of other various colors can be obtained with a high efficient ratio and good color rendering properties.

Next, a method for manufacturing the semiconductor light emitting device 201 according to this embodiment will be described.

The already described method can be used as a process of manufacturing the semiconductor light emitting element 110. Accordingly, a process after the semiconductor light emitting element 110 is completed will be described below.

First, a metal film serving as the reflecting film 23 is formed on the inner surface of the container 22 by, for example, a spattering method. This metal film is patterned so that the reflecting film 23 is left on the inner side surfaces and the bottom surface of the container 22, respectively.

Next, the first and second gold bumps 25a and 25b are disposed by a ball bonder in the semiconductor light emitting element 110. The semiconductor light emitting element 110 is fixed onto the submount 24 having the n-side mounting electrode 24a and the p-side mounting electrode 24b. This submount 24 is installed and fixed on the reflecting film 23 of the bottom surface of the container 22. These components can be fixed using adhesion by an adhesive, solder, and the like. The semiconductor light emitting element 110 can also be directly fixed onto the submount 24 without using the first and second gold bumps 25a and 25b by the ball bonder.

Next, the n-side mounting electrode 24a and the p-side mounting electrode 24b on the submount 24 are connected to electrodes provided on the container 22 side, not shown, by the bonding wire 26.

The first fluorescent layer 211 including the red fluorescent body is formed so as to cover the semiconductor light emitting element 110 and the bonding wire 26. The second fluorescent layer 212 including a blue, green, or yellow fluorescent body is formed on this first fluorescent layer 211.

As a method of forming each of the fluorescent layers, each of the fluorescent bodies dispersed into a resin raw material mixed solution is dropped, and the obtained solution is thermally polymerized by heat treatment to cure the resin. The resin raw material mixed solution containing each of the fluorescent bodies is dropped, is left for a while, and subsequently is cured. Thereby, particulates of each of the fluorescent bodies can sediment so that the particulates of each of the fluorescent bodies can be unevenly distributed in a lower portion of each of the first and second fluorescent layers 211 and 212. Thus, it is possible to control the light emitting efficiency of each of the fluorescent bodies as appropriate. Subsequently, the cover 27 is provided on the fluorescent layers, and the semiconductor light emitting device 201 according to this embodiment, i.e., a white LED, is manufactured.

A part of the light generated in the semiconductor light emitting element is directly extracted to the outside of the element. Another part of the light is repeatedly reflected in the reflecting film, the interface between the semiconductor layer and the substrate, the interface between the substrate and open air, and the like and extracted from a surface of the element, a surface of the substrate, or a side surface of the element to the outside. A part of the light is absorbed by the n-side electrode or the like having a low reflection efficiency, and it causes reduced light extraction efficiency. Particularly, in the case of the white LED having a combination of a near-ultraviolet LED having a wavelength of the emitting light of 370 to 400 nm and a fluorescent layer, in order to have a low absorption coefficient and avoid leakage of the near-ultraviolet light to the outside in the fluorescent layer for the near-ultraviolet LED, especially in the red fluorescent layer, it is necessary to apply more fluorescent layers. As a result, returned light to the LED chip increases. The area of the n-side electrode, which is an absorption region as viewed from the fluorescent layer side, cannot be ignored from a viewpoint of efficiency of the white LED.

As the semiconductor light emitting element according to this embodiment, the fluorescent layers are applied to a LED chip in which the n-side electrode having a low reflectance is reduced to a minimum area necessary to reduce the operating voltage and the pad region having a relatively wide area and the wider highly reflective region are secured. Thereby, the efficiency of the white LED can be improved, and the effect of this invention can be enhanced.

When the highly reflective insulating layer 60 (for example, a dielectric multilayer) in the semiconductor light emitting element according to this embodiment is optically designed in accordance with 380 nm of an emission wavelength, high reflectivity to visible light that enters vertically to the highly reflective insulating layer 60 is not shown. However, in the highly reflective insulating layer 60, a wavelength region that shows high reflectivity is widened as the incident angle is inclined. The high reflectivity is shown in approximately all of the regions of the visible light at the incident angle inclined 30 degrees to the film surface.

Moreover, a reflective metal film having reflectivity to the visible light can also be disposed on the laminated structure body 10s side of the n-side pad layer 41. As this reflective metal film, aluminum and rhodium can be used, for example. Namely, the n-side pad layer 41 is provided on the laminated structure body 10s side and can include a layer including at least one of aluminum, an aluminum alloy, rhodium, and a rhodium alloy.

Thereby, a component of the visible light emitted from the excited fluorescent layers and returned toward the LED chip can efficiently be reflected and extracted to the outside of the semiconductor light emitting element. Thereby, a phase of the light that reaches the aforementioned reflective metal film can also be controlled to form a structure that increases reflectivity.

Herein, a "nitride semiconductor" includes semiconductors of all the compositions represented by the chemical formula $B_x In_y Al_z Ga_{1-x-y-z}N$ ($0 \leq s\ x \leq 1$, $0 \leq y \leq 1$, $0 \leq z \leq 1$, $x+y+z \leq 1$) in which the composition ratio of x, y, and z is varied within the range. In the aforementioned chemical formula, moreover, the "nitride semiconductor" also includes semiconductors further including a V group element other than N (nitrogen), and semiconductors further including one of various dopants added in order to control a conductivity type or the like.

Hereinabove, exemplary embodiments of the invention are described with reference to specific examples. However, the invention is not limited to these specific examples. For example, one skilled in the art may appropriately select specific configurations of components included in semiconductor light emitting elements and semiconductor light emitting devices such as N-type semiconductor layers, p-type semiconductor layers, light emitting layers, well layers, barrier layers, n-side electrodes, p-side electrodes, highly reflective insulating layers, dielectric laminated films, upper metal layers, mounting components, wavelength conversion portions, fluorescent bodies, and the like from known art and similarly practice the invention. Even modifications with respect to shapes, sizes, qualities of materials, and crystal growth processes for the specific configuration of each of the components and with respect to crystal growth processes are made by one skilled in the art, such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, semiconductor light emitting elements and semiconductor light emitting devices practicable by an appropriate design modification by one skilled in the art based on the semiconductor light emitting elements and semiconductor light emitting devices described above as exemplary embodiments of the invention also are within the scope of the invention to the extent that the purport of the invention is included.

Furthermore, various modifications and alterations within the spirit of the Invention will be readily apparent to those skilled in the art. All such modifications and alterations should therefore be seen as within the scope of the invention.

The invention claimed is:

1. A semiconductor light emitting element, comprising:
   a laminated structure body including an n-type semiconductor layer, a p-type semiconductor layer, and a light emitting layer provided between the n-type semiconductor layer and the p-type semiconductor layer;
   a p-side electrode provided in contact with the p-type semiconductor layer;
   an n-side electrode provided in contact with the n-type semiconductor layer, a reflectance of the n-side electrode being lower than a reflectance of the p-side electrode;
   a highly reflective insulating layer provided in contact with the n-type semiconductor layer and having a higher reflectance to light emitted from the light emitting layer than a reflectance of the n-side electrode to the light, the highly reflective insulating layer and the n-side electrode not covering each other; and
   an upper metal layer electrically connected to the n-side electrode, at least a part of the n-side electrode and at least a part of the highly reflective insulating layer being disposed between the upper metal layer and the n-type semiconductor layer, and a part of the upper metal layer being in direct contact with the n-type semiconductor layer,
   an area of a region of the n-side electrode in contact with the n-type semiconductor layer being smaller than an area of a region of the highly reflective insulating layer sandwiched between the n-type semiconductor layer and the upper metal layer, and
   the upper metal layer completely covering the n-side electrode and the highly reflective insulating layer.

2. The element according to claim 1, wherein
   the laminated structure body further includes a substrate made of sapphire and provided on a side of a second main surface opposite to the first main surface.

3. The element according to claim 2, wherein
   the laminated structure body is formed on the substrate via a single-crystal aluminum nitride layer.

4. The element according to claim 3, wherein
   the aluminum nitride layer has a first portion and a second portion, the first portion is provided between the substrate and a second portion, the first portion has a carbon concentration relatively higher than a carbon concentration in the second portion.

5. The element according to claim 1, wherein the upper metal layer includes a first layer and a second layer, the first layer being disposed between the second layer and the n-type semiconductor layer.

6. The element according to claim 5, wherein a reflectance of the first layer to the light is higher than a reflectance of the second layer to the light.

7. The element according to claim 5, wherein the first layer includes at least one of Ag or Al, and the second layer includes Au.

8. The element according to claim 1, wherein
   the n-side electrode includes a transparent conductive film provided on a side of the n-type semiconductor layer and having translucency to the light.

9. The element according to claim 8, wherein
   the transparent conductive film has ohmic property to the n-type semiconductor layer.

10. The element according to claim 1, wherein
    an area of a region of the n-side electrode facing the upper metal layer is smaller than the area of the region of the highly reflective insulating layer sandwiched between the n-type semiconductor layer and the upper metal layer.

11. The element according to claim 1, wherein
    the n-type semiconductor layer is exposed in an exposed region on a side of a first main surface of the laminated structure body, a part of the p-type semiconductor layer being removed in the exposed region,
    the n-side electrode and the highly reflective insulating layer are provided in contact with the exposed n-type semiconductor layer,
    the p-side electrode is provided in contact with the p-type semiconductor layer on a side of the first main surface, and
    at least a part of the n-side electrode is provided closer to a side of the p-side electrode than the highly reflective insulating layer in a plane parallel to the first main surface.

12. The element according to claim 1, wherein
    a peak wavelength of the light is not less than 370 nanometers and not more than 400 nanometers.

13. The element according to claim 1, wherein
    the upper metal layer includes a layer provided on a side of the laminated structure body and including at least one of aluminum, an aluminum alloy, rhodium, and a rhodium alloy.

14. The element according to claim 1, wherein
    the n-side electrode has ohmic property to the n-type semiconductor layer.

15. The element according to claim 1, wherein
    the n-side electrode includes at least one of silver and a silver alloy.

16. The element according to claim 1, wherein
    the p-side electrode includes at least one of silver and a silver alloy.

17. The element according to claim 1, wherein
the p-side electrode includes a silver contained film in contact with the p-type semiconductor layer and a platinum contained film stacked with the silver contained film.

18. The element according to claim 1, wherein
the upper metal layer is connected to a connection member.

19. The element according to claim 1, wherein
the highly reflective insulating layer includes a plurality of dielectric films alternatively laminated and having a different refractive index from each other.

20. The element according to claim 1, wherein
the highly reflective insulating layer includes at least one of oxide, nitride, or acid nitride of at least one of silicon (Si), aluminum (Al), zirconium (Zr), titanium (Ti), niobium (Nb), tantalum (Ta), magnesium (Ma), hafnium (Hf), cerium (Ce), and zinc (Zn).

21. The element according to claim 1, wherein
the highly reflective insulating layer includes a silicon oxide contained film and a titanium oxide contained film.

22. The element according to claim 1, wherein the highly reflective insulating layer contacts the n-side electrode.

23. The element according to claim 1, wherein
the highly reflective insulating layer is apart from the n-side electrode, and
the part of the upper metal layer is in direct contact with the n-type semiconductor layer between the highly reflective insulating layer and the n-side electrode.

24. A semiconductor light emitting device comprising:
a semiconductor light emitting element; and
a mounting component, the semiconductor light emitting element being mounted on the mounting component,
the semiconductor light emitting element including:
  a laminated structure body including an n-type semiconductor layer, a p-type semiconductor layer, and a light emitting layer provided between the n-type semiconductor layer and the p-type semiconductor layer;
  a p-side electrode provided in contact with the p-type semiconductor layer;
  an n-side electrode provided in contact with the n-type semiconductor layer, a reflectance of the n-side electrode being lower than a reflectance of the p-side electrode;
  a highly reflective insulating layer provided in contact with the n-type semiconductor layer and having a higher reflectance to light emitted from the light emitting layer than a reflectance of the n-side electrode to the light, the highly reflective insulating layer and the n-side electrode not covering each other; and
  an upper metal layer electrically connected to the n-side electrode, at least a part of the n-side electrodes and at least a part of the highly reflective insulating layer being disposed between the upper metal layer and the n-type semiconductor layer, and a part of the upper metal layer being in direct contact with the n-type semiconductor layer,
an area of a region of the n-side electrode in contact with the n-type semiconductor layer being smaller than an area of a region of the highly reflective insulating layer sandwiched between the n-type semiconductor layer and the upper metal layer,
the n-type semiconductor layer being exposed in an exposed region on a side of a first main surface of the laminated structure body, a part of the p-type semiconductor layer being removed in the exposed region,
the n-side electrode and the highly reflective insulating layer being provided in contact with the exposed n-type semiconductor layer,
the p-side electrode being provided in contact with the p-type semiconductor layer on a side of the first main surface of the laminated structure body, the n-side electrode being provided on the first main surface of the laminated structure body,
the mounting component including a plurality of mounting electrodes,
the first main surface of the laminated structure body and the mounting electrodes of the mounting component being disposed to face each other,
the upper metal layer being electrically connected to one of the mounting electrodes, and the p-side electrode being electrically connected to another one of the mounting electrodes, and
the upper metal layer completely covering the n-side electrode and the highly reflective insulating layer.

25. The device according to claim 24, wherein the upper metal layer includes a first layer and a second layer, the first layer being disposed between the second layer and the n-type semiconductor layer.

26. The device according to claim 25, wherein a reflectance of the first layer to the light is higher than a reflectance of the second layer to the light.

27. The device according to claim 25, wherein the first layer includes at least one of Ag or Al, and the second layer includes Au.

28. The device according to claim 25, further comprising:
a connecting member electrically connecting the upper metal layer and the one of the mounting electrodes,
the second layer having at least one of
  an adhesion to the connecting member higher than an adhesion of the first layer to the connecting member,
  a resistance against diffusion of elements included in the connecting member higher than a resistance of the first layer against diffusion of the elements included in the connecting member, or
  a resistance against increase in temperature higher than a resistance of the second layer against increase in temperature.

29. The device according to claim 24, further comprising:
a wavelength conversion layer absorbing the light and emitting light having a wavelength different from a wavelength of the light.

30. The device according to claim 24, wherein the highly reflective insulating layer contacts the n-side electrode.

31. The device according to claim 24, wherein
the highly reflective insulating layer is apart from the n-side electrode and
the part of the upper metal layer is in direct contact with the n-type semiconductor layer between the highly reflective insulating layer and the n-side electrode.

* * * * *